(12) United States Patent
Yeo et al.

(10) Patent No.: US 11,133,711 B2
(45) Date of Patent: Sep. 28, 2021

(54) WIRELESS POWER TRANSMITTER, WIRELESS POWER RECEIVING ELECTRONIC DEVICE, AND METHOD FOR OPERATING THE SAME

(71) Applicant: Samsung Electronics Co., Ltd., Gyeonggi-do (KR)

(72) Inventors: Sung-Ku Yeo, Seoul (KR); Dae-Hyun Kim, Incheon (KR); Young-Joon Kim, Gyeonggi-do (KR); Kang-Ho Byun, Gyeonggi-do (KR); Hyo-Seok Han, Gyeonggi-do (KR); Ki-Young Kim, Gyeonggi-do (KR); Ji-Hoon Jung, Seoul (KR); Jae-Hyun Park, Seoul (KR); Eun-Song Um, Gyeonggi-do (KR)

(73) Assignee: Samsung Electronics Co., Ltd

( * ) Notice: Subject to any disclaimer, the term of this patent is extended or adjusted under 35 U.S.C. 154(b) by 517 days.

(21) Appl. No.: 15/951,871

(22) Filed: Apr. 12, 2018

(65) Prior Publication Data

US 2018/0301940 A1 Oct. 18, 2018

Related U.S. Application Data

(60) Provisional application No. 62/484,473, filed on Apr. 12, 2017.

(30) Foreign Application Priority Data

Jun. 27, 2017 (KR) .......................... 10-2017-0081380

(51) Int. Cl.
*H02J 50/12* (2016.01)
*G01R 21/06* (2006.01)
(Continued)

(52) U.S. Cl.
CPC .............. *H02J 50/12* (2016.02); *G01R 21/06* (2013.01); *G05F 1/66* (2013.01); *H02J 50/20* (2016.02);
(Continued)

(58) Field of Classification Search
None
See application file for complete search history.

(56) References Cited

U.S. PATENT DOCUMENTS 8,265,617 B2 9/2012 Lazaridis
10,601,468 B2 * 3/2020 Kowalski ................ H02J 50/10
(Continued)

FOREIGN PATENT DOCUMENTS

JP 2007149844 6/2007
JP 2015-153773 8/2015
(Continued)

OTHER PUBLICATIONS

U.S. Office Action dated Oct. 31, 2019 issued in counterpart U.S. Appl. No. 15/951,887, 39 pages.
(Continued)

*Primary Examiner* — Jared Fureman
*Assistant Examiner* — Joel Barnett
(74) *Attorney, Agent, or Firm* — The Farrell Law Firm, P.C.

(57) ABSTRACT

An electronic device and method are provided for wirelessly receiving power. The electronic device includes a first core including a first portion extending in a first direction and a second portion extending in a second direction different from the first direction, a first coil wound around the first portion and extending in the first direction, a second coil wound around the second portion and extending in the second direction, and a power processing circuit configured to process power wirelessly received, from a wireless power
(Continued)

transmitter, through at least one of the first coil or the second coil.

12 Claims, 37 Drawing Sheets

(51) Int. Cl.
　　*H02J 50/60*　　　(2016.01)
　　*H02J 50/40*　　　(2016.01)
　　*G05F 1/66*　　　(2006.01)
　　*H02J 50/80*　　　(2016.01)
　　*H02J 50/20*　　　(2016.01)
(52) U.S. Cl.
　　CPC .............. *H02J 50/40* (2016.02); *H02J 50/60* (2016.02); *H02J 50/80* (2016.02)

(56) References Cited

U.S. PATENT DOCUMENTS

| | | | |
|---|---|---|---|
| 2007/0179231 | A1 | 8/2007 | Sonobe |
| 2010/0078343 | A1 | 4/2010 | Hoellwarth |
| 2010/0109931 | A1 | 5/2010 | Esnard |
| 2010/0144284 | A1 | 6/2010 | Chutorash |
| 2010/0161004 | A1 | 6/2010 | Najafi |
| 2011/0040996 | A1 | 2/2011 | Hackborn et al. |
| 2012/0235636 | A1* | 9/2012 | Partovi ................. B60L 53/126 320/108 |
| 2012/0248886 | A1 | 10/2012 | Kesler et al. |
| 2012/0248887 | A1 | 10/2012 | Kesler et al. |
| 2013/0043734 | A1 | 2/2013 | Stone et al. |
| 2013/0285603 | A1 | 10/2013 | Zeinstra |
| 2014/0225562 | A1 | 8/2014 | Li et al. |
| 2015/0008876 | A1 | 1/2015 | Kwak et al. |
| 2015/0066155 | A1* | 3/2015 | Haque .................. A61F 2/4202 623/24 |
| 2016/0001663 | A1 | 1/2016 | Chae |
| 2016/0013661 | A1 | 1/2016 | Kurs et al. |
| 2016/0043562 | A1 | 2/2016 | Lisi |
| 2016/0099576 | A1 | 4/2016 | Ho |
| 2016/0099609 | A1 | 4/2016 | Leabman |
| 2016/0099610 | A1 | 4/2016 | Leabman |
| 2016/0172890 | A1* | 6/2016 | Jeong ...................... H02J 7/025 320/108 |
| 2016/0183009 | A1 | 6/2016 | Kim |
| 2016/0286169 | A1 | 9/2016 | Sannala |
| 2016/0352152 | A1 | 12/2016 | Karalis et al. |
| 2017/0012925 | A1 | 1/2017 | Tekin et al. |
| 2017/0012966 | A1 | 1/2017 | De Foy |
| 2017/0013188 | A1 | 1/2017 | Kothari |
| 2017/0013228 | A1 | 1/2017 | Kalendra et al. |
| 2017/0054302 | A1 | 2/2017 | Nirantare et al. |
| 2017/0063161 | A1 | 3/2017 | Sugiyama |
| 2017/0104368 | A1 | 4/2017 | Radke |
| 2017/0222484 | A1 | 8/2017 | DeBaun |
| 2017/0236638 | A1 | 8/2017 | Mayo |
| 2018/0247544 | A1 | 8/2018 | Mustafix |
| 2018/0248613 | A1 | 8/2018 | Peitzer |
| 2018/0343150 | A1 | 11/2018 | Vaughn |

FOREIGN PATENT DOCUMENTS

| | | |
|---|---|---|
| KR | 10-2013-0050094 | 5/2013 |
| KR | 10-2014-0017292 | 2/2014 |
| KR | 1020150004635 | 1/2015 |
| KR | 10-2015-0105697 | 9/2015 |
| KR | 1020160040354 | 4/2016 |
| KR | 1020170013550 | 2/2017 |
| WO | WO 2016/048008 | 3/2016 |

OTHER PUBLICATIONS

International Search Report dated Jul. 4, 2018 issued in counterpart application No. PCT/KR2018/004093, 11 pages.
U.S. Office Action dated Mar. 5, 2020 issued in counterpart U.S. Appl. No. 15/951,856, 27 pages.
U.S. Office Action dated Oct. 7, 2019 issued in counterpart U.S. Appl. No. 15/951,856, 30 pages.
European Search Report dated Nov. 29, 2019 issued in counterpart application No. 18783655.6-1202, 9 pages.

* cited by examiner

| | Distance (m) | Transmission/reception efficiency | Wireless charging scheme | Magnitude (W) of transmit power | Magnitude (W) of receive power | Temperature (°C) | Capability |
|---|---|---|---|---|---|---|---|
| TV(151) (ID#1) | 0.51 | 0.62 | Resonance | 400 | 248 | 80 | First capability |
| First peripheral device 131 (ID#2) | 0.23 | 0.71 | Resonance | 340 | 241 | 73 | Second capability |
| Second peripheral device 132 (ID#3) | 0.14 | 0.82 | Induction | 410 | 336 | 86 | Third capability |
| Third peripheral device 133 (ID#4) | 0.21 | 0.75 | Resonance | 310 | 233 | 91 | Fourth capability |

FIG.21

WIRELESS POWER TRANSMITTER, WIRELESS POWER RECEIVING ELECTRONIC DEVICE, AND METHOD FOR OPERATING THE SAME

CROSS-REFERENCE TO RELATED APPLICATION(S)

This application is based on and claims priority under 35 U.S.C. § 119 to U.S. Provisional Application No. 62/484,473, which was in the U.S. Patent and Trademark Office on Apr. 12, 2017, and to Korean Patent Application Serial No. 10-2017-0081380, which was filed in the Korean Intellectual Property Office on Jun. 27, 2017, the disclosure of each of which is incorporated herein by reference in its entirety.

BACKGROUND

1. Field

The disclosure relates generally to wireless power transmitters for wirelessly transmitting power, electronic devices for wirelessly receiving power, and methods for operating the same.

2. Description of the Related Art

Portable digital communication devices have become must-have items as the users thereof desire to receive high-quality services anytime, anywhere. Recently, thanks to the Internet of things (IoT), various sensors, home appliances, and communication devices have been connected as a single network. However, in order to effectively operate the various sensors, a wireless power transmission system is needed.

Wireless power transmission may be performed in a magnetic induction, magnetic resonance, and electromagnetic wave scheme. The magnetic induction or magnetic resonance scheme is advantageous for charging electronic devices positioned within a relatively short distance from the wireless power transmitter, but the electromagnetic wave scheme is more advantageous for longer distance power transmission, e.g., that reaches several meters, than the magnetic induction or magnetic resonance scheme. The electromagnetic wave scheme is primarily intended for long-distance power transmission, and is able to detect a location of a remote power receiver and efficiently deliver power.

The increasing efficiency of wireless power transmission and reception is driving high power consuming electronic devices, e.g., televisions (TVs), to wirelessly receive power and operate. As compared with smaller electronic devices consuming relatively less power, e.g., smartphones or tablet personal computers (PCs), TVs or other high power consuming devices will require relatively more power on wireless power transmission.

The efficiency of wireless power transmission/reception may vary depending on relative positions between the wireless power transmitter and the electronic device receiving power. Despite frequent position changes, the wireless power transmitter or the electronic device should provide relatively high efficiency.

Additionally, the long-term wireless transmission/reception of a relatively high magnitude of power may cause the power transmission coil or the magnetic material (e.g., a ferrite core) in the coil to saturate.

SUMMARY

Accordingly, the present disclosure is made to address at least the problems and/or disadvantages described above and to provide at least the advantages described below.

An aspect of the present disclosure is to provide a wireless power transmitter and an electronic device that may maintain a relatively high wireless power transmission/reception efficiency, e.g., higher than a predetermined efficiency, despite a position change of the wireless power transmitter or electronic device.

Another aspect of the present disclosure is to provide a wireless power transmitter and an electronic device that may prevent saturation of a power transmission coil or a magnetic material in a coil, despite wireless transmission/reception of a relatively high magnitude of power.

In accordance with an embodiment, an electronic device is provided, which includes a first core including a first portion extending in a first direction and a second portion extending in a second direction different from the first direction, a first coil wound around the first portion and extending in the first direction, a second coil wound around the second portion and extending in the second direction, and a power processing circuit configured to process power wirelessly received, from a wireless power transmitter, through at least one of the first coil or the second coil.

In accordance with another embodiment, a wireless power transmitter is provided, which includes a first core; a first coil wound around the first core; a second core physically separated from the first core; a second coil wound around the second core; a first inverter configured to provide, to the first coil, a first frequency of alternating current (AC) power for charging an electronic device; and a second inverter configured to provide, to the second coil, a second frequency of AC power for charging the electronic device while providing the first frequency of AC power to the first coil. The second frequency has a preset difference from the first frequency.

In accordance with another embodiment, an electronic device is provided, which includes a core including a first portion extending in a first direction, a second portion connected with the first portion and extending in a second direction different from the first direction, and a third portion connected with the second portion and extending in the first direction; a first coil wound around the first portion and extending in the first direction; a second coil wound around the second portion and extending in the second direction; a third coil wound around the third portion and extending in the first direction; and a power processing circuit configured to process power wirelessly received from a wireless power transmitter through at least one of the first coil and the second coil.

In accordance with another embodiment, an electronic device is provided, which includes a plurality of coils; a power processing circuit configured to process power received through the plurality of coils; a switching circuit configured to selectively connect at least one of the plurality of coils to the power processing circuit; and a control circuit configured to control the switching circuit to connect a first combination of the plurality of coils to the power processing circuit.

In accordance with another embodiment, a method for operating is provided for an electronic device including a plurality of coils and a power processing circuit. The method includes determining a first combination of the plurality of coils to wirelessly receive power from a wireless power transmitter; and connecting the first combination of the plurality of coils to the power processing circuit.

BRIEF DESCRIPTION OF THE DRAWINGS

The above and other aspects, features, and advantages, of certain embodiments of the present disclosure will be more apparent from the following detailed description taken in conjunction with the accompanying drawings, in which:

FIG. 21 illustrates a table for managing information for an electronic device to wirelessly receive power according to an embodiment.

DETAILED DESCRIPTION

Figure 1:
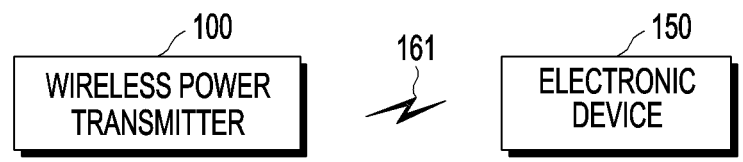
FIG. 1 illustrates a wireless power transmitter and an electronic device according to an embodiment.

Hereinafter, various embodiments of the present disclosure are described with reference to the accompanying drawings. However, it should be appreciated that the present disclosure is not limited to the embodiments and the terminology used herein, and all changes and/or equivalents or replacements thereto also belong to the scope of the present disclosure. The same or similar reference numerals may be used to refer to the same or similar elements throughout the specification and the drawings.

Singular forms "a," "an," and "the" include plural references unless the context clearly dictates otherwise. Herein, the terms "A or B" or "at least one of A and/or B" may include all possible combinations of A and B. The terms "first" and "second" may modify various components regardless of importance and/or order and are used to distinguish a component from another without limiting the components. When an element (e.g., a first element) is referred to as being (operatively or communicatively) "coupled with/to," or "connected with/to" another element (e.g., a second element), the first element can be directly coupled or connected with/to the second element or can be indirectly coupled or connected with/to the second element via a third element.

The term "configured to" may be interchangeably used with other terms, such as "suitable for," "capable of," "modified to," "made to," "adapted to," "able to," or "designed to" in hardware or software in the context. The term "configured to" may mean that a device can perform an operation together with another device or parts. For example, "a processor configured (or set) to perform A, B, and C" may refer to a generic-purpose processor (e.g., a central processing unit (CPU) or application processor (AP)) that may perform the operations by executing one or more software programs stored in a memory device, or a dedicated processor (e.g., an embedded processor) for performing the operations.

A wireless power transmitter or an electronic device according to an embodiment of the present disclosure may include a smartphone, a tablet PC, a mobile phone, a video phone, an e-book reader, a desktop PC, a laptop computer, a netbook computer, a workstation, a server, a personal digital assistant (PDA), a portable multimedia player (PMP), a MP3 player, a medical device, a camera, or a wearable device. The wearable device may include an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device.

The wireless power transmitter or electronic device may also include a TV, a set-top box, which is wiredly or wirelessly interworking with a TV, a digital video disk (DVD) player, an audio player, a refrigerator, an air conditioner, a cleaner, an oven, a microwave oven, a washer, a drier, an air cleaner, a home automation control panel, a security control panel, a media box, a gaming console, an electronic dictionary, an electronic key, a camcorder, an electric car, or an electronic picture frame.

The wireless power transmitter or electronic device may also include a medical device (e.g., a portable medical measuring device, such as a blood sugar measuring device, a heartbeat measuring device, or a body temperature measuring device, a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, a sailing electronic device (e.g., a sailing navigation device or a gyro compass), avionics, a security device, a vehicular head unit, an industrial or home robot, a drone, an automatic teller machine (ATM), a point of sales (POS) device, or an IoT device (e.g., a light bulb, various sensors, a sprinkler, a fire alarm, a thermostat, a street light, a toaster, fitness equipment, a hot water tank, a heater, or a boiler).

The wireless power transmitter or electronic device may also be part of a piece of furniture, building/structure or vehicle, an electronic board, an electronic signature receiving device, a projector, or a measurement device (e.g., a device for measuring water, electricity, gas, or electromagnetic waves).

The wireless power transmitter or electronic device may also be flexible and/or may be a combination of the above-enumerated electronic devices. However, the wireless power transmitter or electronic device is not limited to the above-listed embodiments.

Herein, the term "user" may refer to a human or another device (e.g., an artificial intelligence electronic device) using the electronic device or the wireless power transmitter.

FIG. 1 illustrates a wireless power transmitter and an electronic device according to an embodiment.

Referring to FIG. 1, a wireless power transmitter 100 may wirelessly transmit power 161 to an electronic device 150 according to various charging schemes. For example, the wireless power transmitter 100 may transmit power 161 using an induction scheme, wherein the wireless power transmitter 100 includes a power source, a direct current (DC)-alternating current (AC) converting circuit, an amplifying circuit, an impedance matching circuit, at least one capacitor, at least one coil, and a communication modulation/demodulation circuit. The at least one capacitor and the at least one coil may constitute a resonance circuit. The wireless power transmitter 100 may be implemented in a scheme defined in the wireless power consortium (WPC) standards (or Qi standards).

The wireless power transmitter 100 may also transmit power 161 using a resonance scheme, wherein the wireless power transmitter 100 includes a power source, a DC-AC converting circuit, an amplifying circuit, an impedance matching circuit, at least one capacitor, at least one coil, and an out-band communication circuit (e.g., a bluetooth low energy (BLE) communication circuit). The at least one capacitor and the at least one coil may constitute a resonance circuit. The wireless power transmitter 100 may be implemented using a scheme defined in the alliance for wireless power (A4WP) standards (or air fuel alliance (AFA) standards).

The wireless power transmitter 100 may include a coil that produces a magnetic field when an electric current flows across the coil by a resonance or induction scheme. The process of the wireless power transmitter 100 producing an induced magnetic field may be represented as the wireless power transmitter 100 wirelessly transmitting the power 161.

Further, the electronic device 150 may include a coil that produces an induced electromotive force by the magnetic field generated around and varying in magnitude over time. The process of the electronic device 150 producing an induced electromotive force through the coil may be represented as the electronic device 150 wirelessly receiving the power 161.

The wireless power transmitter 100 may also transmit power 161 using an electromagnetic wave scheme, wherein the wireless power transmitter 100 includes a power source, a DC-AC converting circuit, an amplifying circuit, a distributing circuit, a phase shifter, a power transmission antenna array including a plurality of patch antennas, and an out-band communication circuit (e.g., a BLE communication module). The plurality of patch antennas each may form a radio frequency (RF) wave (e.g., an electromagnetic wave).

The electronic device 150 may include patch antennas capable of outputting electric current using RF waves generated around. The process of the wireless power transmitter 100 producing an RF wave may be represented as the wireless power transmitter 100 wirelessly transmitting the power 161. The process of the electronic device 150 outputting electric current from the patch antennas using RF waves may be represented as the electronic device 150 wirelessly receiving the power 161.

The wireless power transmitter 100 may communicate with the electronic device 150, e.g., using an in-band scheme.

The wireless power transmitter 100 or the electronic device 150 may vary the load (or impedance) on the data to be transmitted, according to, e.g., an on/off keying modulation scheme.

The wireless power transmitter 100 or the electronic device 150 may determine data transmitted from the opposite device by measuring a variation in load or impedance based on a variation in the current, voltage, or power across the coil.

The wireless power transmitter 100 may communicate with the electronic device 150 using an out-band scheme. The wireless power transmitter 100 or the electronic device 150 may communicate data using a communication circuit (e.g., a BLE communication module) provided separately from the coil or patch antennas.

Herein, the "wireless power transmitter 100, the electronic device 150, or another electronic device performs a particular operation" may indicate that various hardware devices, e.g., a control circuit, such as a processor, a coil, or a patch antenna, included in the wireless power transmitter 100, the electronic device 150, or the other electronic device performs the particular operation. The "wireless power transmitter 100, the electronic device 150, or another electronic device performs a particular operation" may also indicate that the processor controls another hardware device to perform the particular operation or that the processor or another hardware device triggers the particular operation as an instruction for performing the particular operation, which is stored in a storage circuit (e.g., a memory) of the wireless power transmitter 100, the electronic device 150, or the other electronic device.

Figure 2:
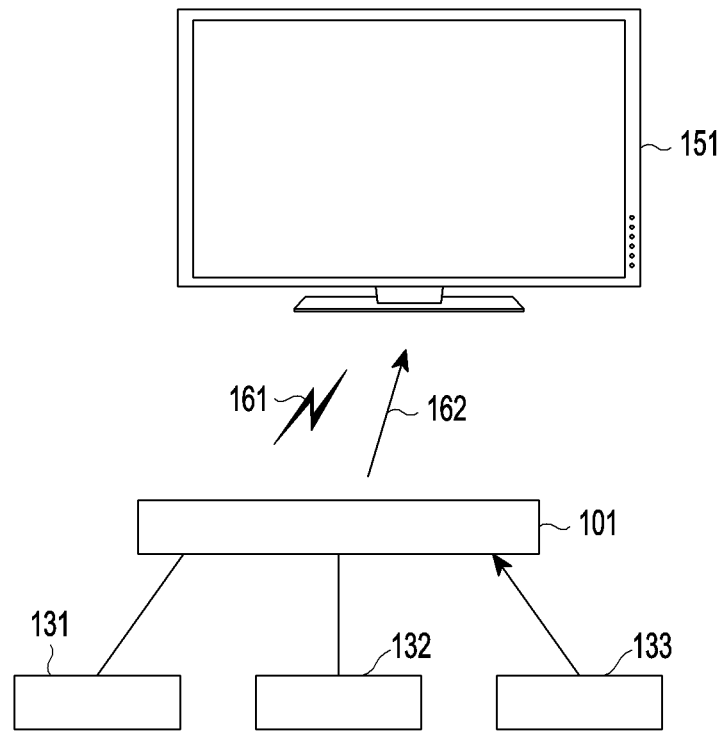
FIG. 2 illustrates a media device and a TV according to an embodiment.

FIG. 2 illustrates a media device and a TV according to an embodiment.

Referring to FIG. 2, the media device 101 may wirelessly transmit power 161 to a TV 151. The media device 101 may be an example of the wireless power transmitter 100. The TV 151 may be an example of the electronic device 150 wirelessly receiving power.

The media device 101 may include a power transmitting circuit according to at least one of various wireless charging schemes as described above. The media device 101 may transmit a communication signal 162 to the TV 151. For example, the communication signal 162 may include at least one of media data displayed on the TV 151, data for controlling wireless charging, or TV control data for controlling the operation of the TV 151. The media data, data for controlling wireless charging, or TV control data may be transmitted and received by the same communication scheme or different communication schemes. For example, the media device 101 may transmit the media data to the TV 151 using a communication scheme defined by the wireless gigabit alliance (Wi-gig), transmit and receive the data for controlling wireless charging using a BLE communication scheme, and transmit the TV control data to the TV 151 using an infrared (IR) module. However, the communication is not limited to a particular scheme.

The TV 151 may include an IR module for receiving control signals using an IR communication scheme from a control device, e.g., a remote control device.

The TV 151 may receive a communication signal 162 including TV control data from the media device 101. The control signal may be a signal including a command for performing an operation. The control signal may be transmitted from a control device. The control device may transmit control signals in any communication scheme without being limited to a particular one.

At least two of the media data, data for controlling wireless charging, and the TV control data may be transmitted and received by a single communication module. For example, the media device 101 may transmit the media data to the TV 151 through a Wi-gig communication scheme and the data for controlling wireless charging and the TV control data through a BLE module.

The media device 101 may wiredly or wirelessly communicate with other peripheral devices 131, 132, and 133. For example, the media device 101 may communicate with a first peripheral device 131 through a high-definition multimedia interface (HDMI)-standard cable, communicate with a second peripheral device 132 through a universal serial bus (USB)-standard cable, and wirelessly communicate with a third peripheral device 133 by a BLE communication scheme. The peripheral devices 131, 132, and 133 may be electronic devices capable of wiredly or wirelessly transmitting media data, such as game players, set-top boxes, DVD players, etc.

The media device 101 may include at least part of media data received from the peripheral devices 131, 132, and 133 in a communication signal 162 and send the communication signal 162 to the TV 151. The media device 101 may send media data that it receives, as is, to the TV 151, or may transcode the received media data and then send the transcoded media data to the TV 151. The media device 101 may process, e.g., decode or image-correct, the received media data and send the processed media data to the TV 151.

The media device 101 may produce media data on its own, rather than receiving media data from the peripheral devices 131, 132, and 133, and send the media data to the TV 151. In this case, the media device 101 may be implemented as an electronic device capable of producing media data, such as a game player, a set-top box, or a DVD player. The media device 101 wirelessly transmitting power and sending media data is merely an example, and the wireless power transmitter and electronic device sending media data may be implemented as other entities.

The media device 101 may wirelessly transmit power to the peripheral devices 131, 132, and 133, as well as to the TV 151. Further, the media device 101 may wirelessly transmit power to another electronic device that includes no communication module.

The media device 101 may determine a magnitude of power to be transmitted to the TV 151 and/or the peripheral devices 131, 132, and 133.

The media device 101 may obtain identification information or rated power information about the TV 151 or the peripheral devices 131, 132, and 133 through communication with the TV 151 or the peripheral devices 131, 132, and 133.

When an electronic device includes no communication module, the media device 101 may obtain identification information or rated power information about the electronic device based on an external input from the user. The media device 101 may determine a magnitude of transmit power based on the rated power information about the electronic device receiving power.

The media device 101 may determine a magnitude of transmit power based on state information about the electronic device receiving power. For example, the TV 151 may consume more power when outputting media data at a brightness of 70% than when at a brightness of 30%. The media device 101 may periodically or aperiodically obtain the current state information about the TV 151. The current state information may include various types of information, such as the display brightness, volume, execution of data communication, three-dimensional (3D) processing, high-definition processing, contrast, brightness-and-darkness, and view mode, which may affect the power consumption of the TV 151.

The media device 101 may transmit power according to the rated power information about the TV 151 and may determine the magnitude of transmit power considering the current state information. The media device 101 may analyze the media data to determine the magnitude of transmit power. For example, when the media data includes a plurality of encoded image frames, the media device 101 may determine the coefficients corresponding to the respective DC components of the encoded image frames. The media device 101 may determine the coefficients corresponding to the DC components before transforming the plurality of encoded image frames. The size of the coefficients corresponding to the respective DC components of the plurality of encoded image frames may be associated with the overall brightness of the image frames after decoding. Accordingly, the media device 101 may determine the brightness information about each image frame by determining the size of the coefficients corresponding to the DC components even before decoding the encoded image frames.

The media device 101 may determine the magnitude of transmit power, corresponding to the per-image frame brightness information. The media device 101 may determine whether a magnitude of transmit power is greater than a magnitude of suppliable power. When the magnitude of transmit power is greater than the magnitude of suppliable power, the media device 101 may transmit power according to a priority, which will be described below in greater detail.

The media device 101 may send the media data that is received from any one of the peripheral devices 131, 132, and 133, to the TV 151, and in this case, the media device 101 may abstain from transmitting power to peripheral devices that are not in use, which will be described below in greater detail.

The media device 101 may determine the magnitude of transmit power based on information (e.g., remaining battery power) about the battery management system (BMS) of each of the peripheral devices 131, 132, and 133.

The media device 101 may determine the magnitude of transmit power according to the transmission efficiency of the TV 151 and the peripheral devices 131, 132, and 133. For example, the media device 101 may charge the TV 151 and the peripheral devices 131, 132, and 133 in highest-to-lowest order of the product of the rated power and the transmission efficiency. However, when some of the entities present higher products, but their transmission efficiency is not more than a threshold (e.g., 50%), the media device 101 may first charge the other entities instead of the higher product entities.

The media device 101 may impart an identification to each of the TV 151 and the peripheral devices 131, 132, and 133. The media device 101 may send identification-including communication signals to an electronic device in order to receive power when controlling the electronic device later. The media device 101 may manage information about the TV 151 and the peripheral devices 131, 132, and 133. For example, the media device 101 may manage information for an electronic device to wirelessly receive power as set forth in the table illustrated in FIG. 21.

The media device 101 may measure the distance to the TV 151 or each peripheral device 131, 132, and 133 in various manners. For example, the media device 101 may make a comparison between the receive strength (e.g., received signal strength indication (RSSI) of a communication signal from each electronic device) and the transmit strength included in the communication signal and measure the distance based on a result of the comparison. The measuring of the distance by the media device 101 is not limited to a particular scheme.

The media device 101 may measure the transmission/reception efficiency for each of the TV 151 or the peripheral devices 131, 132, and 133. For example, the media device 101 may transmit test power to each of the TV 151 and the peripheral devices 131, 132, and 133. The media device 101 may receive information about the magnitude of received power from each of the TV 151 and the peripheral devices 131, 132, and 133. The information about the magnitude of received power may be any information (e.g., a voltage or current value at the input or output terminal of the rectifier of the electronic device) that may represent the magnitude of power received by the electronic device, without being limited to particular information.

The media device 101 may determine the transmission/reception efficiency by comparing information about the magnitude of power input to the power transmission coil and information about the magnitude of power received by the electronic device, but is not limited thereto.

The media device 101 may determine a wireless charging scheme for each of the TV 151 and the peripheral devices 131, 132, and 133. The media device 101 may determine the wireless charging scheme that an electronic device supports, and when the electronic device supports a plurality of wireless charging schemes, the media device 101 may choose the most efficient wireless charging scheme.

The media device 101 may determine the magnitude of transmit power for each of the TV 151 and the peripheral devices 131, 132, and 133, e.g., according to the rated power information about each of the TV 151 and the peripheral devices 131, 132, and 133, or based on information about the current state of each of the TV 151 and the peripheral devices 131, 132, and 133. In this case, the media device 101 may manage the information about the current state of each of the TV 151 or the peripheral devices 131, 132, and 133, along with other information. The media device 101 may receive and manage information about the current power consumption for each electronic device receiving power.

The media device 101 may determine the magnitude of transmit power according to efficiency. For example, at an efficiency less than or equal to 50%, the media device 101 may set the magnitude of transmit power to be relatively low, preventing a waste of power, e.g., lower than a predetermined power consumption threshold.

The media device 101 may manage information about the magnitude of receive power of each of the TV 151 and the peripheral devices 131, 132, and 133.

The media device 101 may manage information about the temperature of each of the TV 151 and the peripheral devices 131, 132, and 133.

The media device 101 may receive communication signals including receive power magnitude information and/or temperature information from the TV 151 or the peripheral devices 131, 132, and 133.

The media device 101 may manage information about the capability of each of the TV 151 and the peripheral devices 131, 132, and 133. The capability may be any information associated with the wireless power transmission/reception capability or media data processing capability, but is not limited thereto.

At least part of the information set forth in the table of FIG. 21 may vary over time, and the media device 101 may update at least part of the information of the table. The media device 101 may control the wireless communication function for the electronic device according to the information set forth in the table of FIG. 21.

The media device 101 may output the degree of exposure of radio waves. For example, the media device 101 may output a safety-related alarm upon transmitting power that exceeds a magnitude permitted by a protocol, e.g., a magnitude safe for human exposure.

The media device 101 may relay power, which is wiredly received from an outlet, to various electronic devices, and process power and perform impedance matching, corresponding to each electronic device.

The media device 101 may wirelessly receive power from another electronic device. The media device 101 may detect escaping removal of the electronic device from the power transmission range or may detect an entry of an obstacle, e.g., a person, into the processor transmission range and stop power transmission accordingly. The media device 101 may output a message to move the electronic device into the power transmission range and/or a message instructing a user to move out of the power transmission range.

When the electronic device includes a communication module, the media device 101 may perform wireless communication, thereby determining whether the electronic device is located within the power transmission range. Unless the electronic device includes a communication module, the media device 101 may allow the electronic device to subscribe to a wireless power network through an external input, provide an identification to the electronic device, and manage various information as set forth in the table of FIG. 21.

The media device 101 may determine the transmission/reception efficiency as set forth in the table of FIG. 21 by using test power, and when the transmission/reception efficiency is lower than a threshold, the media device 101 may output a message instructing a user to adjust the arrangement of the electronic devices.

The media device 101 may output at least part of the information of the table in FIG. 21 as a user-identifiable message.

Upon receipt of an external input to stop charging from the user, the media device 101 may stop charging a particular electronic device or all the electronic devices. Despite stopping charging a particular electronic device, the media device 101 may maintain the communication link with the particular electronic device by transmitting minimum power to the electronic device.

The media device 101 may detect the electronic device wirelessly receiving power using a radio frequency identification (RFID) detection scheme or a near-field communication (NFC) tag detection scheme.

The media device 101 may detect the electronic device located in a particular location through an illuminance sensor.

The media device 101 may use its embedded IR sensor to receive IR signals from the electronic device, thus detecting the electronic device.

The media device 101 may include a fingerprint sensor and use the fingerprint sensor to detect that the electronic device is positioned on the fingerprint sensor.

Figure 3A:
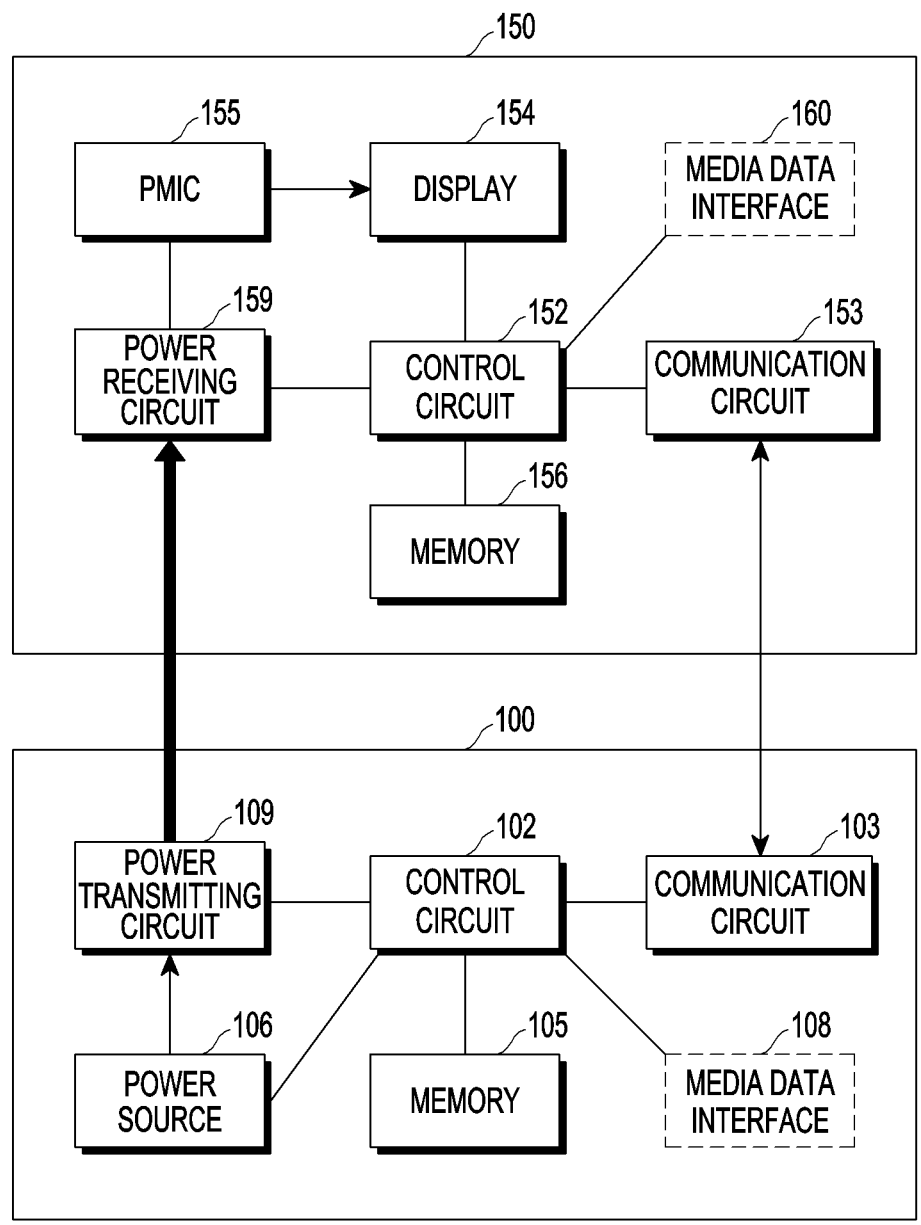
FIG. 3A illustrates a wireless power transmitter and an electronic device according to an embodiment.

FIG. 3A illustrates a wireless power transmitter and an electronic device according to an embodiment.

Referring to FIG. 3A, a wireless power transmitter 100 includes a power transmitting circuit 109, a control circuit 102, a communication circuit 103, a memory 105, a power source 106, and media data interface 108. An electronic device 150 includes a power receiving circuit 159, a control circuit 152, a communication circuit 153, a display 154, a power management integrated circuit (PMIC) 155, a memory 156, and a media data interface 160.

The power transmitting circuit 109 may wirelessly transmit power to the power receiving circuit 159 using at least one of an induction scheme, a resonance scheme, or an electromagnetic wave scheme.

The control circuit 102 may control the magnitude of power that the power transmitting circuit 109 transmits. For example, the control circuit 102 may control the magnitude of power output from the power source 106 and control the gain of a power amplifier included in the power transmitting circuit 109, thereby controlling the magnitude of power that the power transmitting circuit 109 transmits. The control circuit 102 may adjust the magnitude of power output from the power source 106 by controlling the duty cycle or the frequency of power output from the power source 106. The control circuit 102 may control the magnitude of power applied to the power transmitting circuit 109 by controlling the magnitude of the bias voltage of the power amplifier.

The control circuit 102 or the control circuit 152 may be implemented in various circuits capable of performing calculation, such as a CPU or a general-purpose processor, a mini-computer, a microprocessor, a micro controlling unit (MCU), or a field programmable gate array (FPGA), but is not limited in type thereto. The control circuit 102 may control at least one of the power source 106 or the power transmitting circuit 109 to transmit, e.g., a first magnitude of power.

The power receiving circuit 159 may wirelessly receive power using at least one of an induction scheme, a resonance scheme, or an electromagnetic wave scheme from the power transmitting circuit 109. The power receiving circuit 159 may perform power processing, such as rectifying the received AC power into a DC waveform, converting the voltage, or regulating the power.

The PMIC 155 may process the power, which has been received and processed, to be appropriate for the hardware (e.g., the display 154) and transfer to each hardware device.

The display 154 may display media data received from, e.g., the media device 101. The electronic device 150 may include various hardware devices as well as the display 154.

The control circuit 152 may control the overall operation of the electronic device 150.

The memory 156 may store instructions for performing the overall operation of the electronic device 150 or store information about the magnitude of power to be transmitted.

The display 154 may include, e.g., a liquid crystal display (LCD), a light emitting diode (LED) display, an organic light emitting diode (OLED) display, a microelectromechanical systems (MEMS) display, an electronic paper display, etc.

The control circuit 152 may receive media data through the communication circuit 153.

The control device 102 may control the communication circuit 103 to transmit media data, which has been received through the media data interface 108, to the electronic device 150. The control circuit 102 may wiredly or wirelessly receive media data from a peripheral device through the media data interface 108. The control device 102 may include the received media data in a communication signal and send the communication signal to the electronic device 150 through the communication circuit 103.

The control device 102 may transcode, decode, or image-enhance the received media data and then send the media data to the electronic device 150. When the wireless power transmitter and the media device are implemented as different entities, the control device 152 may wiredly or wirelessly receive media data from the media device through the media data interface 160.

The memory 105 may store instructions for performing the operation of the wireless power transmitter 100, e.g., information for determining the magnitude of power to be transmitted. The memory 105 or the memory 156 may be a read only memory (ROM), a random-access memory (RAM), or a flash memory, but is not limited in thereto.

Figure 3B:
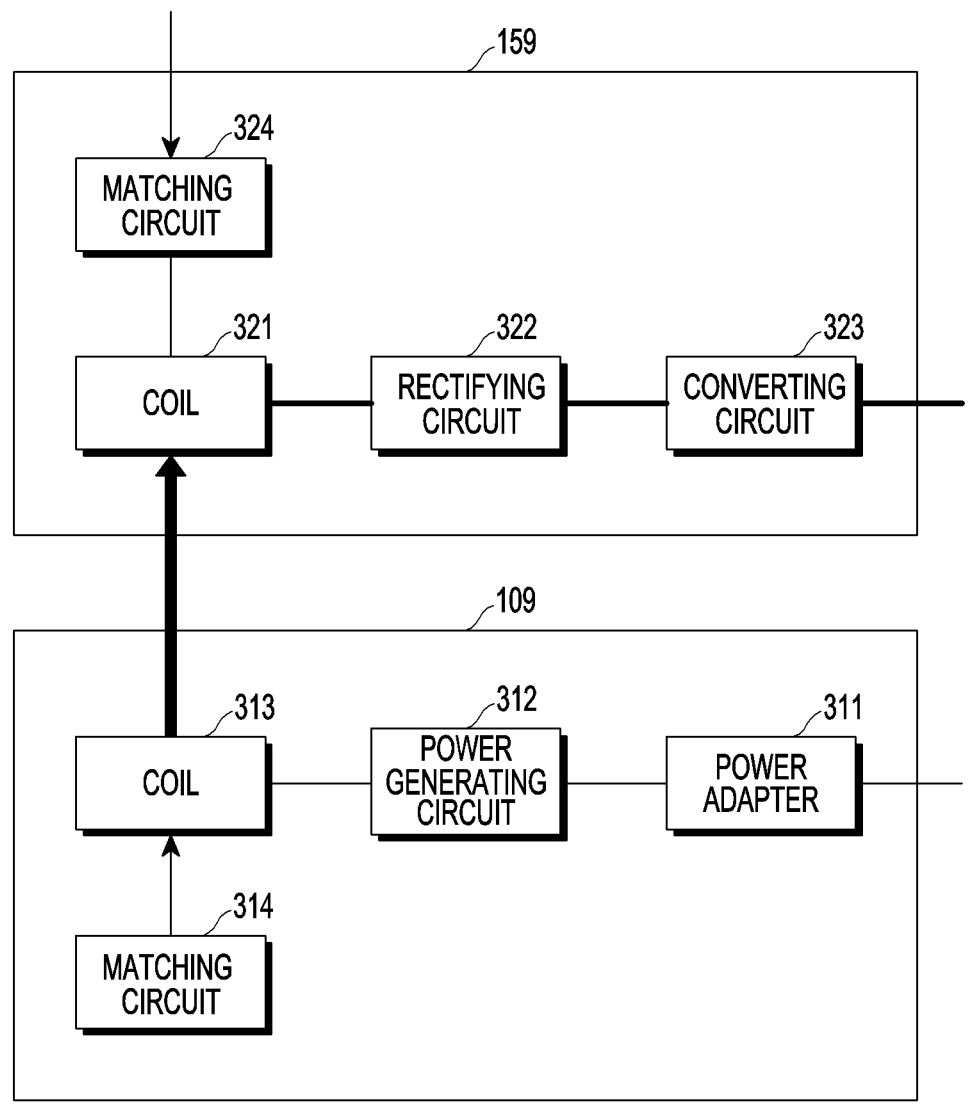
FIG. 3B illustrates a power transmitting circuit and a power receiving circuit for an induction scheme or resonance scheme according to an embodiment.

FIG. 3B illustrates a power transmission circuit and a power reception circuit using an induction scheme or resonance scheme according to an embodiment.

Referring to FIG. 3B, the power transmitting circuit 109 includes a power adapter 311, a power generating circuit 312, a coil 313, and a matching circuit 314. The power adapter 311 may receive power from the power source 106 and provide the power to the power generating circuit 312. The power generating circuit 312 may convert the received power, e.g., into an AC waveform, or may amplify the received power and transfer the amplified power to the coil 313. The frequency of the AC waveform may be set to a value from 100 kHz to 205 kH or 6.78 MHz depending on a standard, but is not limited thereto.

When power is applied to the coil 313, an induced magnetic field that varies in magnitude over time may be produced across the coil 313, thus allowing for wireless transmission of power.

The power transmitting circuit 109 may include capacitors that, along with the coil 313, constitute a resonance circuit. The matching circuit 314 may impedance-match the power transmitting circuit 109 with the power receiving circuit 159 by varying the capacitance and/or reactance of the circuit connected with the coil 313 under the control of the control circuit 102. An induced electromotive force may be generated at the coil 321 of the power receiving circuit 159 by the magnetic field that varies in magnitude over time, and accordingly, the power receiving circuit 159 may wirelessly receive power.

The rectifying circuit 322 may rectify the AC waveform of received power. A converting circuit 323 may adjust the voltage of the rectified power and transfer the voltage to the PMIC 155.

The power receiving circuit 159 may further include a regulator. Alternatively, the converting circuit 323 may be replaced with a regulator.

The matching circuit 324 may impedance-match the power transmitting circuit 109 with the power receiving circuit 159 by varying the capacitance and/or reactance of the circuit connected with the coil 321 under the control of the control circuit 152.

Figure 3C:
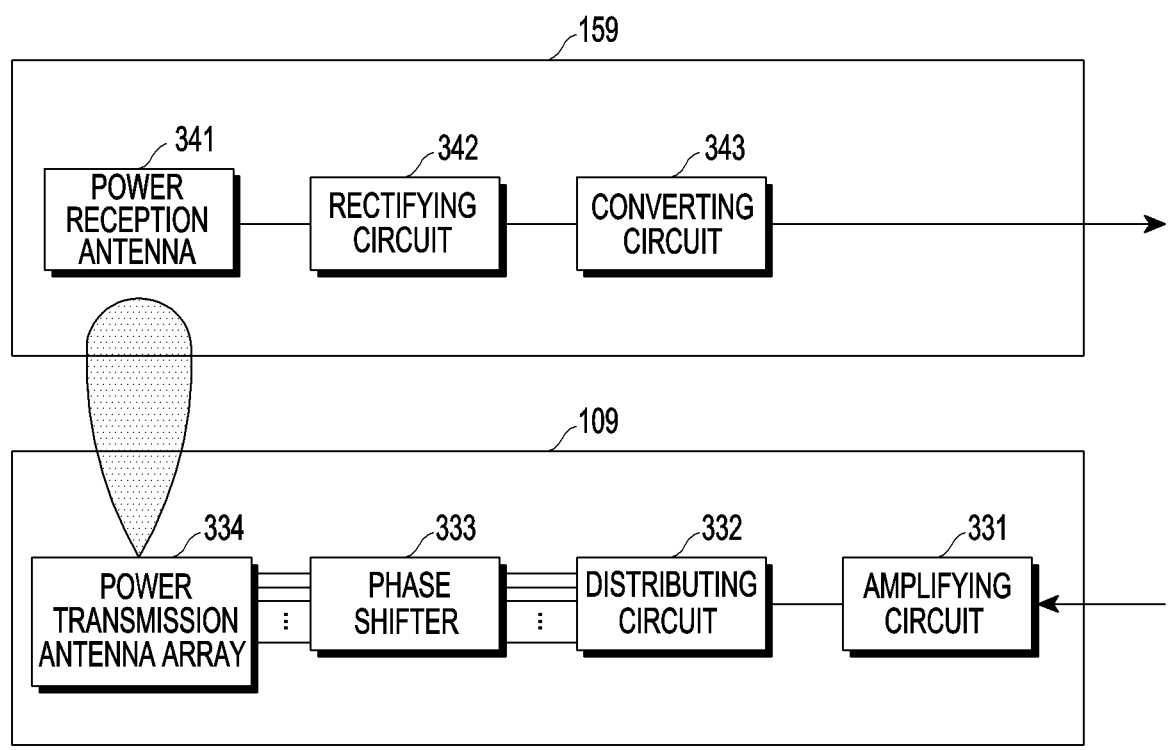
FIG. 3C illustrates a power transmitting circuit and a power receiving circuit for an electromagnetic wave scheme according to an embodiment.

FIG. 3C illustrates a power transmission circuit and a power reception circuit using an electromagnetic wave scheme according to an embodiment.

Referring to FIG. 3C, the power transmitting circuit 109 includes an amplifying circuit 331, a distributing circuit 332, a phase shifter 333, and a power transmission antenna array 334. The power receiving circuit 159 includes a power reception antenna 341, a rectifying circuit 342, and a converting circuit 343.

The amplifying circuit 331 may amplify the power received from the power source 106 and provide the power to the distributing circuit 332. The amplifying circuit 331 may be implemented as a drive amplifier (DA), a high power amplifier (HPA), a gain block amplifier (GBA), or a combination thereof, but is not limited in type thereto.

The distributing circuit 332 may distribute the power output from the amplifying circuit 331 into a plurality of paths. Any circuit capable of distributing input power or signal into a plurality of paths may serve as the distributing circuit 332 without being limited to a particular one. For example, the distributing circuit 332 may distribute power into as many paths as the number of patch antennas included in the power transmission antenna array 334.

The phase shifter 333 may shift (or delay) phase of each of the plurality of AC power signals provided from the distributing circuit 332. Alternatively, a plurality of phase shifters 333 may be provided. For example, the number of the phase shifters 333 may be the same as the number of patch antennas included in the power transmission antenna array 334. A hardware device, such as the HMC642 or the HMC1113, may be used as the phase shifter 333. The degree of shifting by each phase shifter 333 may be controlled by the control circuit 102. The control circuit 102 may determine the location of the electronic device 150 and may phase-shift each of the plurality of AC power signals to allow the RF waves to constructively interfere with each other, i.e., to be beamformed, in the location of the electronic device 150 (or the location of the power reception antenna 341).

Each of the plurality of patch antennas included in the power transmission antenna array 334 may generate a sub RF wave based on the received power. The RF waves, which result from interference among the sub RF waves, may be converted into current, voltage, or power at the power reception antenna 341 and may be outputted.

The power reception antenna 341 may include a plurality of patch antennas. The power reception antenna 341 may use ambient RF waves, i.e., electromagnetic waves, to produce AC waveforms of current, voltage, or power which may be referred to as "received power."

The rectifying circuit 342 may rectify the received power into a DC waveform. The converting circuit 343 may increase or decrease the voltage of the DC waveform of power to a preset value and output to the PMIC 155.

At least one of the power transmission circuit 109 or the power reception circuit 159 may include the hardware according to the induction scheme or resonance scheme as illustrated in FIG. 3B or the hardware according to the electromagnetic wave scheme as illustrated in FIG. 3C. In this case, the control circuit 102 or the control circuit 152 may choose a charging scheme according to various conditions and may control the appropriate hardware to be driven corresponding to the chosen charging scheme. Alternatively, the control circuit 102 or the control circuit 152 may adopt the induction scheme, resonance scheme, and the electromagnetic wave scheme and may drive all of the hardware included to transmit and receive power.

Figure 4A:
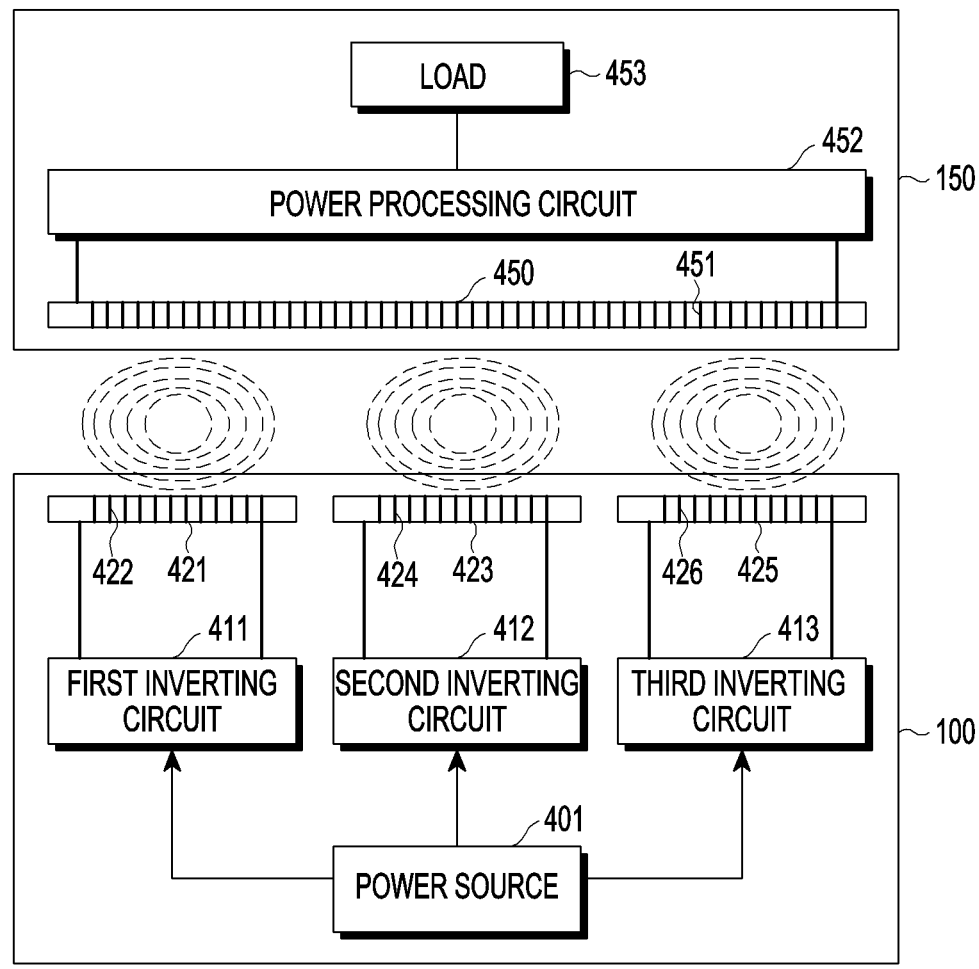
FIGS. 4A to 4C illustrates coils according to an embodiment.
Figure 4B:
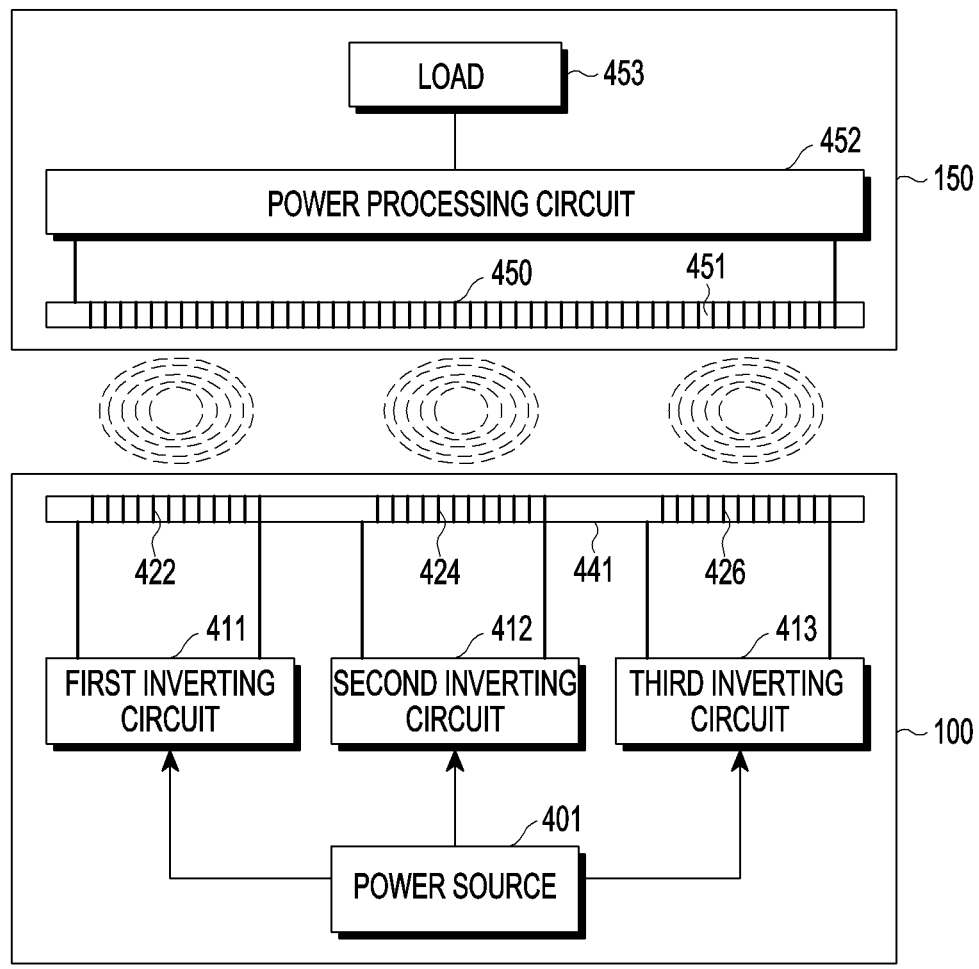
Figure 4C:
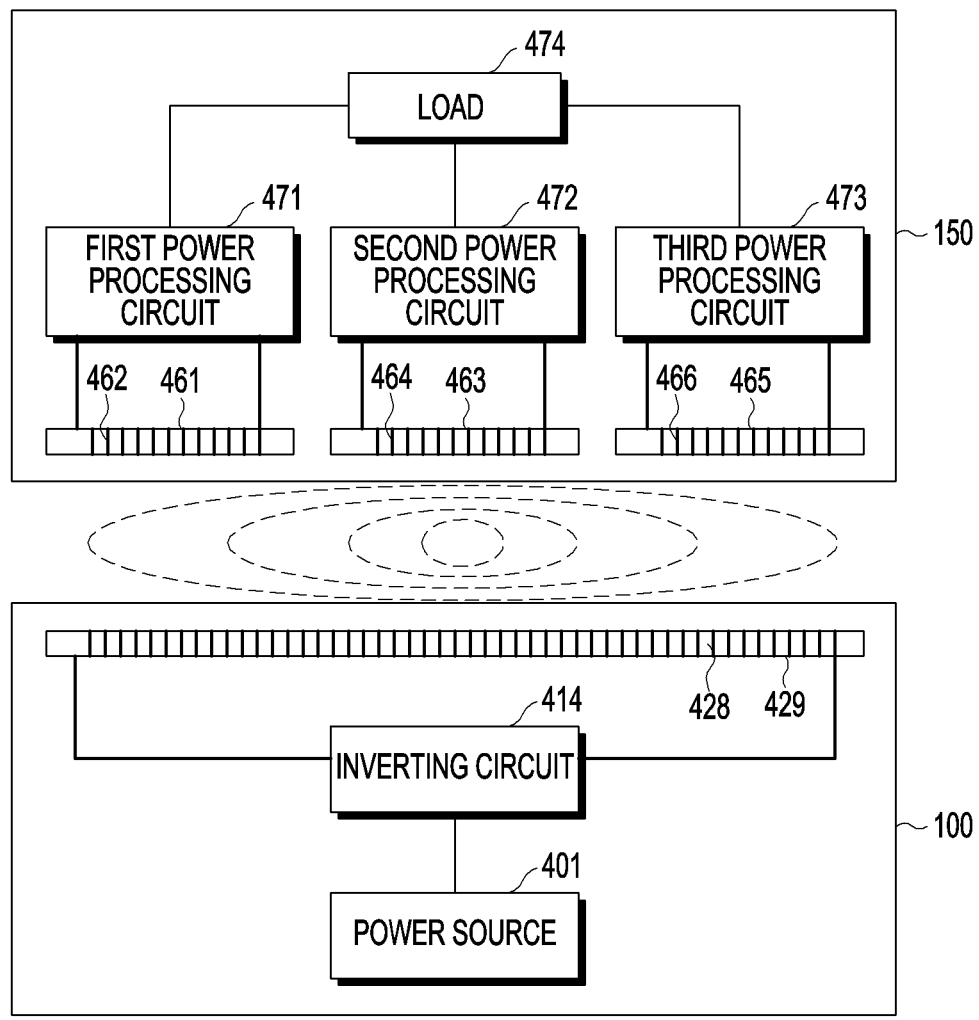

FIGS. 4A to 4C illustrate coils according to an embodiment.

Referring to FIG. 4A, a wireless power transmitter 100 includes a power source 401, inverting circuits 411, 412, and 413, and power transmission coils 422, 424, and 426. A first power transmission coil 422 is wound around a first core 421, a second power transmission coil 424 is wound around a second core 423, and a third power transmission coil 426 is wound around a third core 425. The cores 421, 423, and 425 may be formed of, but are not limited to, a magnetic material, e.g., ferrite, which increase the magnetic flux. Thus, dipole coils wound around their respective cores may be included in the wireless power transmitter 100. The first core 421, the second core 423, and the third core 425 may be physically spaced apart from each other.

When a relatively high magnitude of power, e.g., power having a magnitude higher than a predetermined magnitude threshold is applied to the coils, the cores may saturate at least partially. The longer cores, the more likely their middle portions in the lengthwise direction are to saturate. Accordingly, physically spacing the cores 421, 423, and 425 apart each other may subject each of the cores 421, 423, and 425 to a relatively short length, e.g., lower than a predetermined length threshold which allows the cores 421, 423, and 425 to be less likely to saturate, thus increasing the lifespan of the wireless power transmitter.

Although FIG. 4A illustrates an example in which the coils 422, 424, and 426 are arranged along the same direction, this is merely example, and the coils 422, 424, and 426 may be arranged in different configurations.

The inverting circuits 411, 412, and 413 may process power received from the power source and distribute the power to the coils 422, 424, and 426, respectively. When DC power is provided from the power source, the inverting circuits 411, 412, and 413 may convert the DC power into AC power and distribute the AC power to the coils 422, 424, and 426, respectively. The inverting circuits 411, 412, and 413 may perform the conversion to present the same frequency or different frequencies of AC power. The inverting circuits 411, 412, and 413 may include amplifiers that amplify the AC power and distribute the amplified AC power to the coils 422, 424, and 426, respectively. When AC power is provided from the power source 401, the inverting circuits 411, 412, and 413 may convert the AC power to have a frequency required for wireless power transmission and distribute the AC power to the coils 422, 424, and 426, respectively. The inverting circuits 411, 412, and 413 may convert AC power to have the same frequency and distribute the AC power to the coils 422, 424, and 426, respectively, or the inverting circuits 411, 412, and 413 may convert AC power to have different frequencies and distribute the AC power to the coils 422, 424, and 426, respectively.

The electronic device 150 includes a power reception coil 451 wound around a core 450, a power processing circuit 452, and a load 453. The power processing circuit 452 may rectify AC power received into DC power. The power processing circuit 452 may also convert the voltage of the rectified power.

Referring to FIG. 4B, the coils 422, 424, and 426 are wound around a single core 441.

Referring to FIG. 4C, the electronic device 150 includes a plurality of coils 462, 464, and 466 for power reception, and the coils 462, 464, and 466 are wound around cores 461, 463, and 465, respectively. The cores 461, 463, and 465 are physically spaced apart from each other.

Power processing circuits 471, 472, and 473 each may rectify received power and convert voltage. The power processing circuits 471, 472, and 473 each may perform rectification according to the frequency of received power.

The wireless power transmitter 100 may include a plurality of separate coils or a single coil. When the wireless power transmitter 100 includes a plurality of separate coils, the plurality of separate coils may be wound around a single core, or each may be wound around a respective one of a plurality of separate cores. The electronic device 150 wirelessly receiving power may include a plurality of separate coils or a single coil. When the electronic device 150 includes a plurality of separate coils, the plurality of separate coils may be wound around a single core, or each may be wound around a respective one of a plurality of separate cores.

At least one of the above-described various types of wireless power transmitters 100 may wirelessly transmit power to at least one of the above-described various types of electronic devices 150.

As set forth above, at least one of the wireless power transmitter 100 or the electronic device 150 may include a plurality of coils. The inverting circuit 414 may process power from the power source 401 and provide the processed power to the coil 428 wound around the core 429. The plurality of coils may be located in various positions of the wireless power transmitter 100 or the electronic device 150, thus ensuring a relatively high wireless power transmission/reception efficiency, e.g., higher than a predetermined efficiency threshold, despite a change in the relative power source between the wireless power transmitter 100 and the electronic device 150. Further, the plurality of coils may be wound around cores that are physically separated, which may prevent the cores from saturating, thereby increasing the lifespan.

Figure 5A:
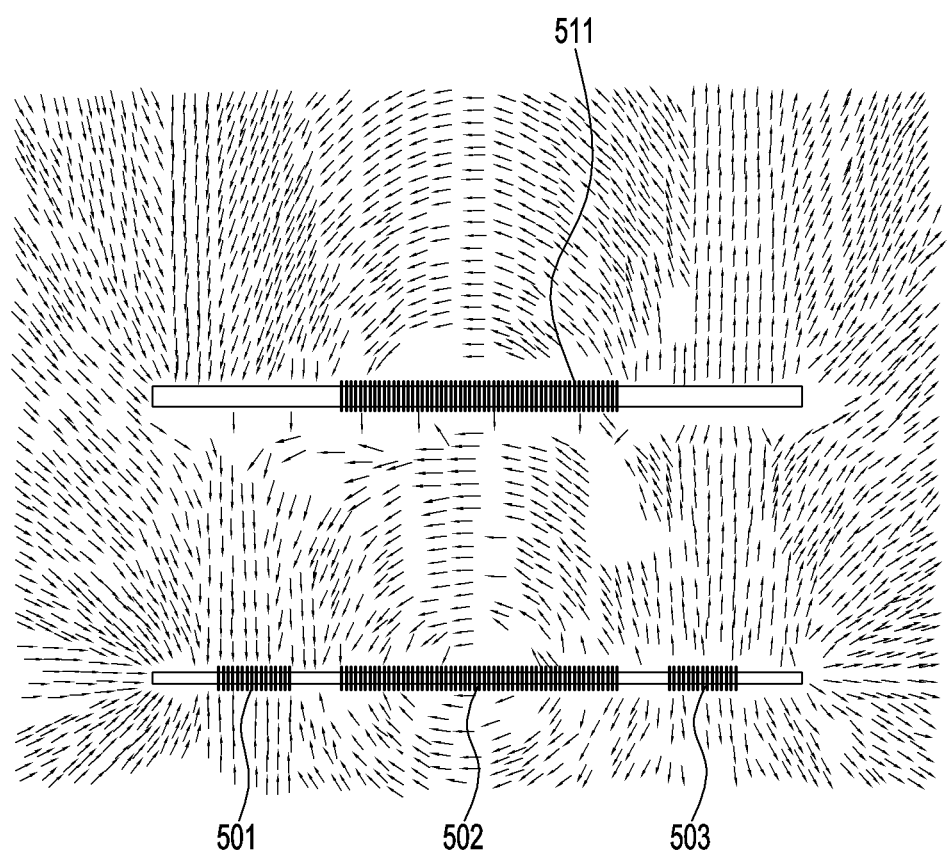
FIG. 5A illustrates magnetic flux around coils according to an embodiment.

FIG. 5A illustrates magnetic flux around coils according to an embodiment.

Referring to FIG. 5A, a relatively large magnitude of magnetic flux may be produced around a plurality of power transmission coils 501, 502, and 503, contributing to an increased freedom in positioning the power reception coil 511.

In FIG. 5A, a different frequency of AC power may be provided to each of the power transmission coils 501, 502, and 503.

Figure 5B:
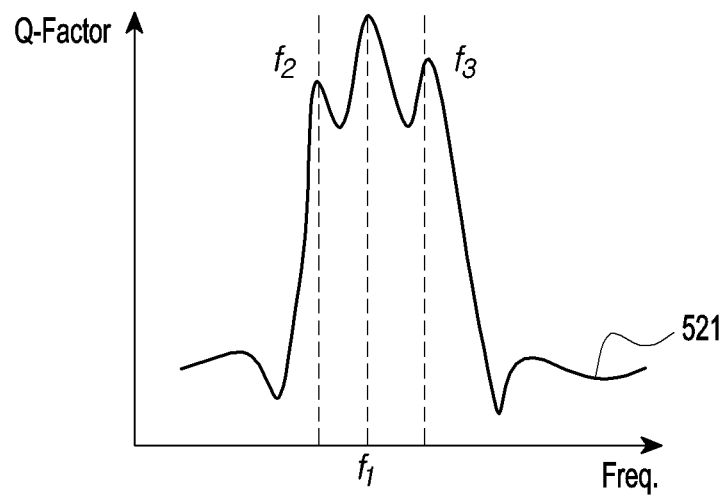
FIG. 5B is a graph illustrating a relation between frequency and Q-factor according to an embodiment.

For example, as illustrated in FIG. 5B, a second frequency f2 of AC power, a first frequency f1 of AC power, and a third frequency f3 of AC power may be provided to a first power transmission coil 501, a second power transmission coil 502, and a third power transmission coil 503, respectively.

FIG. 5B is a graph illustrating a relation between frequency and Q-factor according to an embodiment.

Referring to FIG. 5B, when different frequencies of AC power are provided to the plurality of coils 501, 502, and 503, respectively, a relatively higher Q-factor 521 may be formed in a relatively broader frequency range.

Figure 5C:
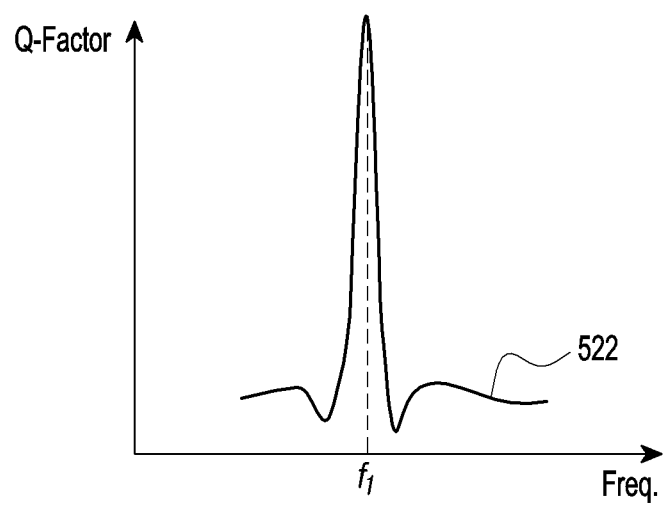
FIG. 5C is a graph illustrating a relation between frequency and Q-factor when applying single frequency AC power to a coil according to an embodiment.

FIG. 5C is a graph illustrating a relation between frequency and Q-factor when applying a single frequency of AC power to a single coil, according to an embodiment.

Referring to FIG. 5C, as a relatively higher Q-factor 522 is formed in a relatively narrower frequency range, a slight misalignment over an ideal one or a failure to achieve a complete impedance matching between the wireless power transmitter 100 and the electronic device 150 may sharply drop the Q-factor 522. The wireless power transmitter 100 provides different frequencies of AC power to their respective corresponding coils 501, 502, and 503, allowing for an increased freedom in positioning the electronic device 150. The differences between the frequencies may be set to be 50% or less of the frequencies, but are not limited thereto. Further, the frequency of power that the wireless power transmitter 100 provides the coils may vary.

Figure 6:
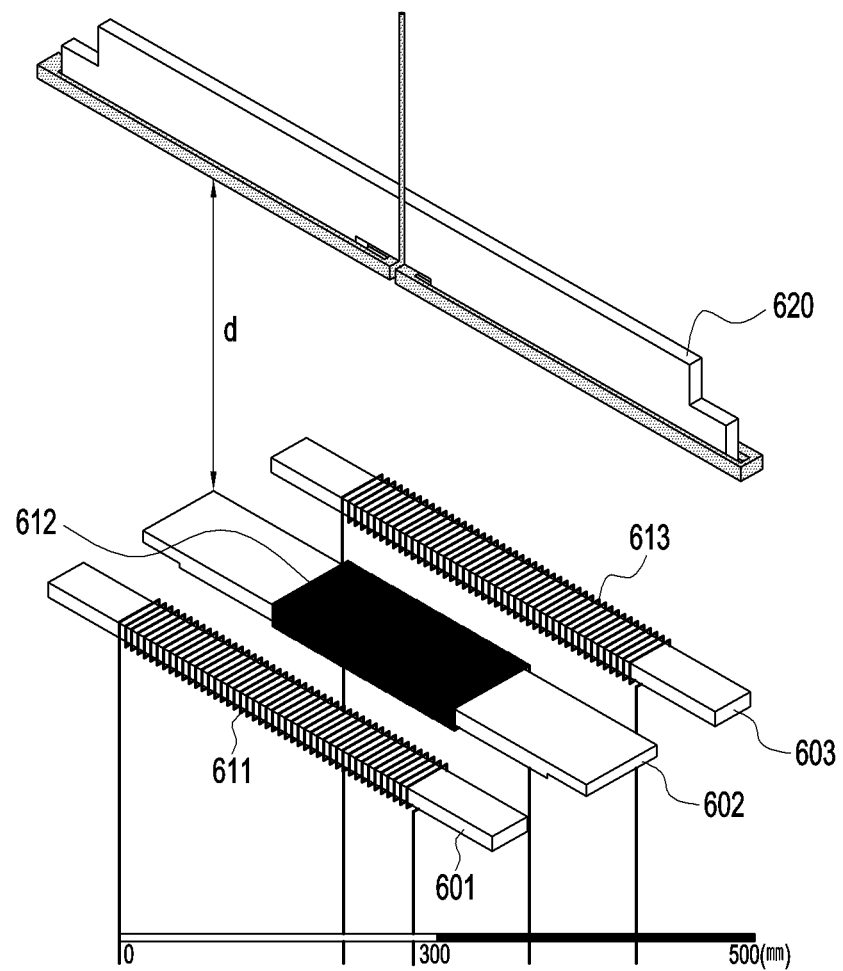
FIG. 6 illustrates a plurality of coils according to an embodiment.

FIG. 6 illustrates a plurality of coils according to an embodiment.

Referring to FIG. 6, a plurality of power transmission coils 611, 612, and 613 are wound around different cores 601, 602, and 603, respectively. The cores 601, 602, and 603 are spaced apart, by a distance (d), from a power receiving circuit 620. A first core 601, a second core 602, and a third core 603 may have different shapes of cross sections, and at least two thereof may have the same shape of cross sections. The coils 611, 612, and 613 may be the same or differ in inter-turn interval or number of turns per unit length. The coils 611, 612, and 613 are arranged parallel with each other, but not in a single line as illustrated in FIG. 4A.

Figure 7:
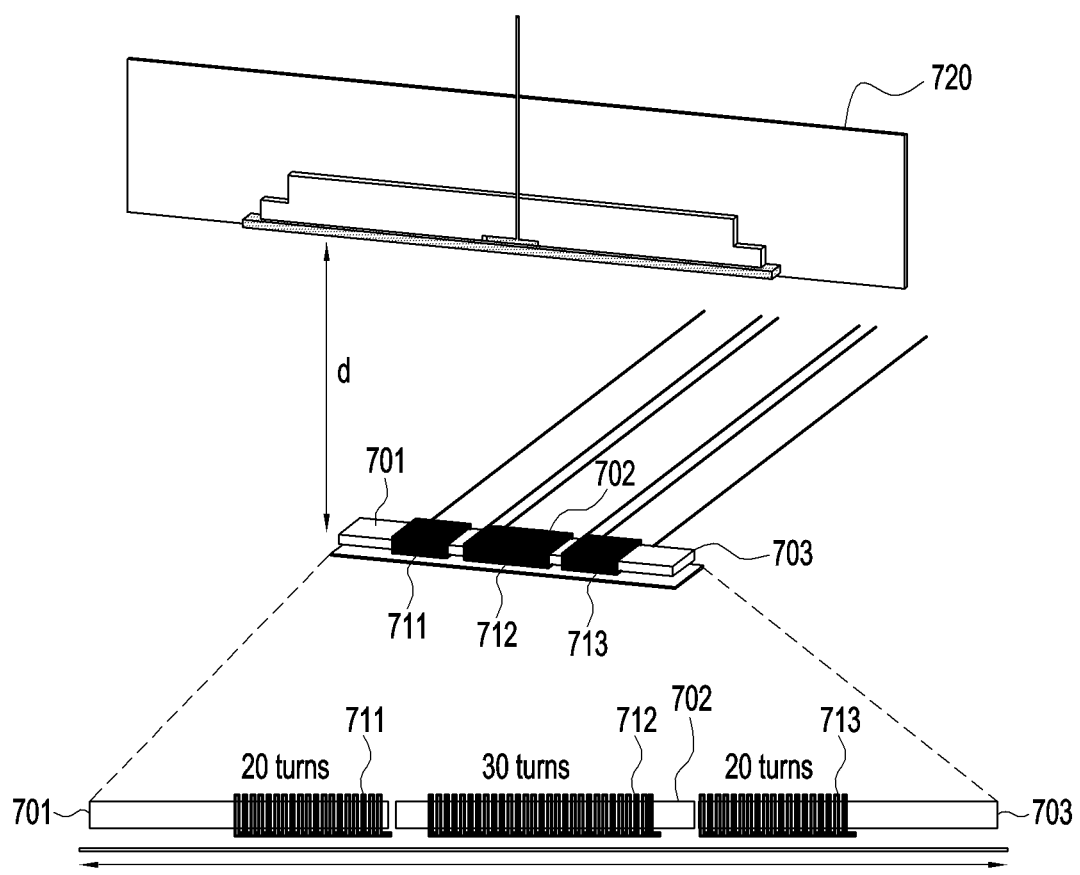
FIG. 7 illustrates a plurality of coils according to an embodiment.

FIG. 7 illustrates a plurality of coils according to an embodiment.

Referring to FIG. 7, a plurality of coils 711, 712, and 713 are wound around a plurality of separate cores 701, 702, and 703, respectively. The plurality of coils 711, 712, and 713 are arranged in a line and are spaced apart, by a distance (d), from a power receiving circuit 720. A first coil 711, a second coil 702, and a third coil 703 may have 20 turns, 30 turns, and 20 turns, respectively. That is, the plurality of coils 711, 712, and 713 may have different numbers of turns.

Figure 8A:
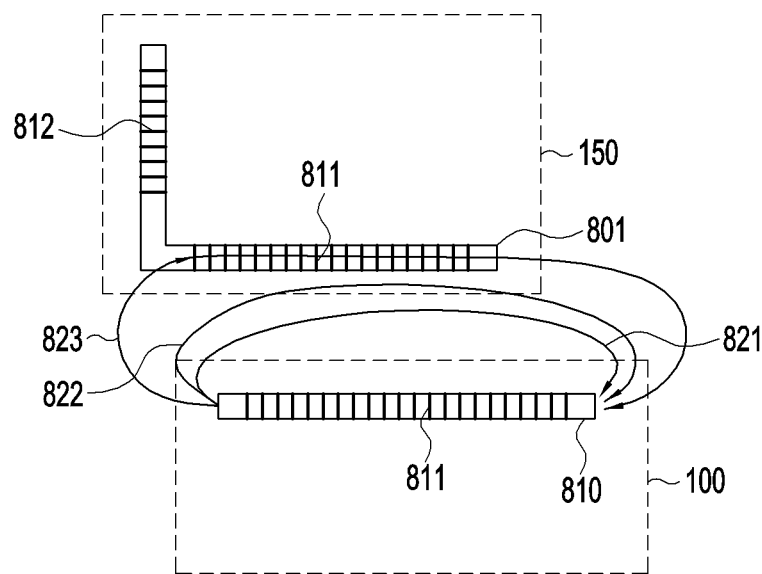
FIGS. 8A and 8B illustrate coils according to an embodiment.
Figure 8B:
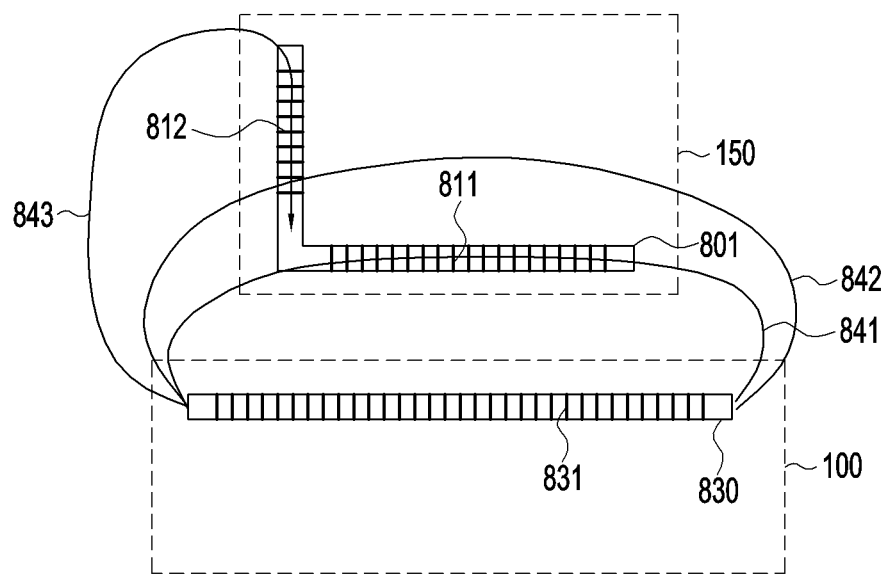

FIGS. 8A and 8B illustrate coils according to an embodiment.

Referring to FIG. 8A, an electronic device 150 receiving power includes an L-shaped core 801, which includes a first portion extending in a first direction and a second portion extending in a direction, e.g., a second direction, different from the first direction. Coils 811 and 812 are wound around the L-shaped core 801. Specifically, the coil 811 and the coil 812 are wound around the first portion and second portion, respectively, of the L-shaped coil 801. Thus, the first coil 801 and the second coil 802 may extend in the first direction and the second direction, respectively. The coil 811 and the coil 812 may be connected in series or parallel with each other or may be disconnected from each other.

A wireless power transmitter 100 includes a power transmission coil 811. The power transmission coil 811 is wound around a core 810. As current flows through the power transmission coil 811, the magnetic flux referenced as 821, 822, and 823 may be generated. At least part of the magnetic flux 821, 822, and 823 formed from the power transmission coil 811 may be incident substantially perpendicular to the cross section of the coil 811. The strength of the magnetic flux 821, 822, and 823 may vary over time, producing an induced electromotive force from the coil 811. Thus, when an end of the wireless power transmitter 100 does not go beyond an end of the electronic device 150, an induced electromotive force may be generated by the coil 811, allowing the electronic device 150 to receive power in a relatively high wireless power transmission/reception efficiency.

As illustrated in FIG. 8B, an end of the wireless power transmitter 100 may be positioned beyond the left end of the electronic device 150. For example, the wireless power transmitter 100 may be relatively longer along the horizontal direction, and the electronic device 150 may be relatively placed corresponding to a middle portion of the wireless power transmitter 100. The power transmission coil 831 may be wound around a core 830. The magnetic flux referenced as 841, 842, and 843 may be generated from the power transmission coil 831. In this case, the magnetic flux 841 may enter substantially perpendicular to the cross section of the coil 811, and the magnetic flux 843 may enter substantially perpendicular to the cross section of the coil 812.

When all of the coils included in the electronic device 150 are arranged in the same direction as the coil 811, the magnetic flux 843 cannot be incident in the direction substantially perpendicular to the coils arranged in the same direction as the coil 811. Since the coils 811 and 812 extending substantially perpendicular to each other are wound around the L-shaped core 801 in FIG. 8B, an induced electromotive force may be produced by the magnetic flux 841, 842, and 843 formed in various directions. This ensures a relatively high wireless power transmission/reception efficiency despite a change in relative positions of the electronic device 150 and the wireless power transmitter 100, thus enhancing the freedom of positioning the electronic device 150.

FIGS. 9A to 9E illustrate coils included in a wireless power transmitter and an electronic device according to an embodiment.

Figure 9A:
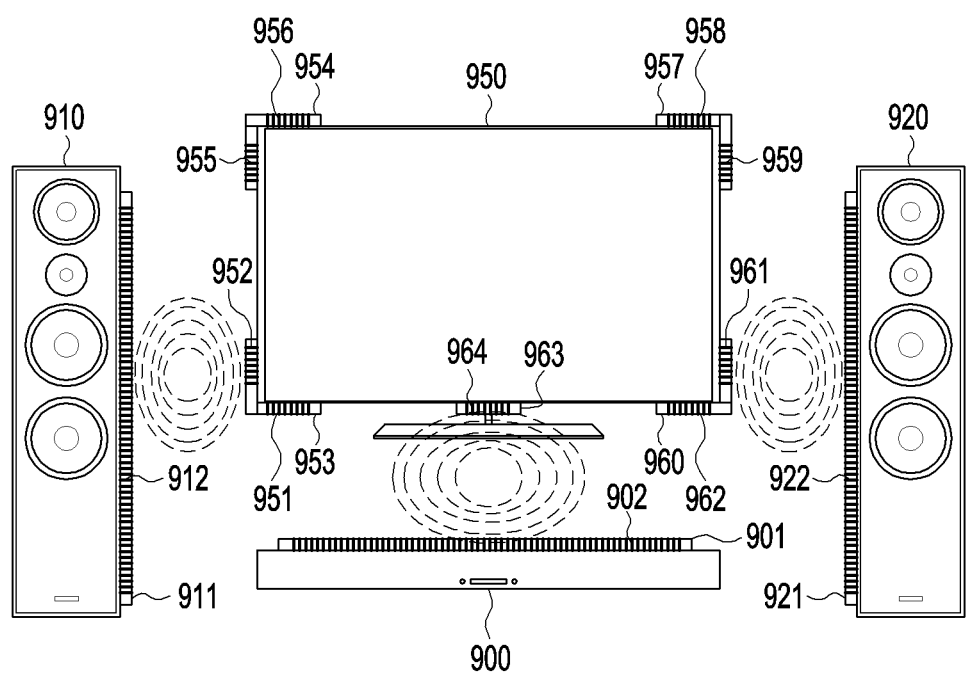
FIGS. 9A to 9E illustrate coils included in a wireless power transmitter and an electronic device according to an embodiment.

Referring to FIG. 9A, an electronic device 950 wirelessly receiving power includes L-shaped cores 953, 954, 957, and 960, which are arranged corresponding to the L-shaped corners of the housing of the electronic device 950. A coil 951 and a coil 952 are wound around the L-shaped core 953 along in a first direction and a second direction, respectively. A coil 956 and a coil 955 are wound around the L-shaped core 954 along in the first direction and the second direction, respectively. A coil 958 and a coil 959 are wound around the L-shaped core 957 along in the first direction and the second direction, respectively. A coil 962 and a coil 961 are wound around the L-shaped core 960 along in the first direction and the second direction, respectively.

The electronic device 950 also includes an I-shaped core 963 around which a coil 964 has been wound along the first direction. The I-shaped core 963 is positioned corresponding to the shape of a lower edge of the housing of the electronic device 950.

A first wireless power transmitter 900 includes a core 901 around which a coil 902 has been wound along the first direction. An induced electromotive force may be generated primarily by the coil 964 using the magnetic flux generated from the coil 902.

A second wireless power transmitter 910 includes a core 911 around which a coil 912 has been wound along the second direction. An induced electromotive force may be generated primarily by the coil 952 using the magnetic flux generated from the coil 912.

A third wireless power transmitter 920 includes a core 921 around which a coil 922 has been wound along a third direction. An induced electromotive force may be generated primarily by the coil 961 using the magnetic flux generated from the coil 921.

Accordingly, although the first wireless power transmitter 900 to the third wireless power transmitter 920 are placed in various positions, the electronic device may receive power in a relatively high wireless power transmission/reception efficiency. Although FIG. 9A illustrates the first wireless power transmitter 900 as a sound bar, and the second wireless power transmitter 910 and the third wireless power transmitter 920 as speakers, the present disclosure is not limited to a particular implementation.

Figure 9B:
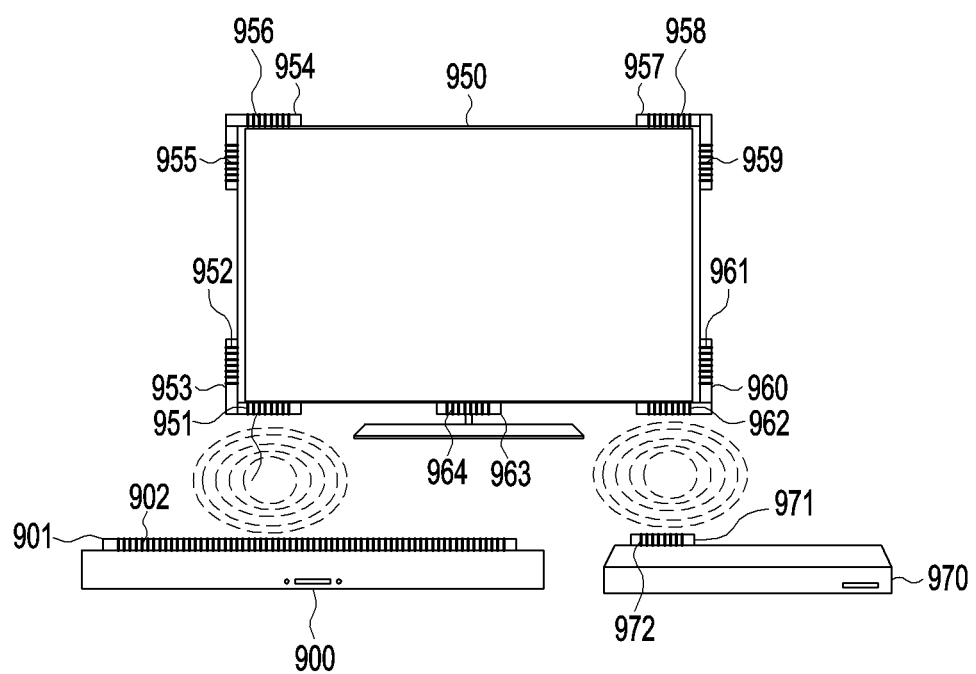

Referring to FIG. 9B, a fourth wireless power transmitter 970 is added. The fourth wireless power transmitter 970 includes an I-shaped core 971 around which a coil 972 has been wound along the first direction. According to the position of the fourth wireless power transmitter 970, the first wireless power transmitter 900 may be positioned shifted relatively to the left. An induced electromotive force may be generated primarily by the coil 951 oriented in the first direction, using the magnetic flux generated from the coil 902 of the first wireless power transmitter 900. An induced electromotive force may be generated by the coil 962 oriented in the first direction, using the magnetic flux from the coil 972 oriented in the first direction in the fourth wireless power transmitter 970.

As described above, although a new wireless power transmitter is added or the wireless power transmitters are shifted from their original positions, the electronic device 950 may receive power in a relatively high wireless power transmission/reception efficiency. Although FIG. 9B illustrates the fourth wireless power transmitter 970 as being a media device, the present disclosure is not limited thereto.

Figure 9C:
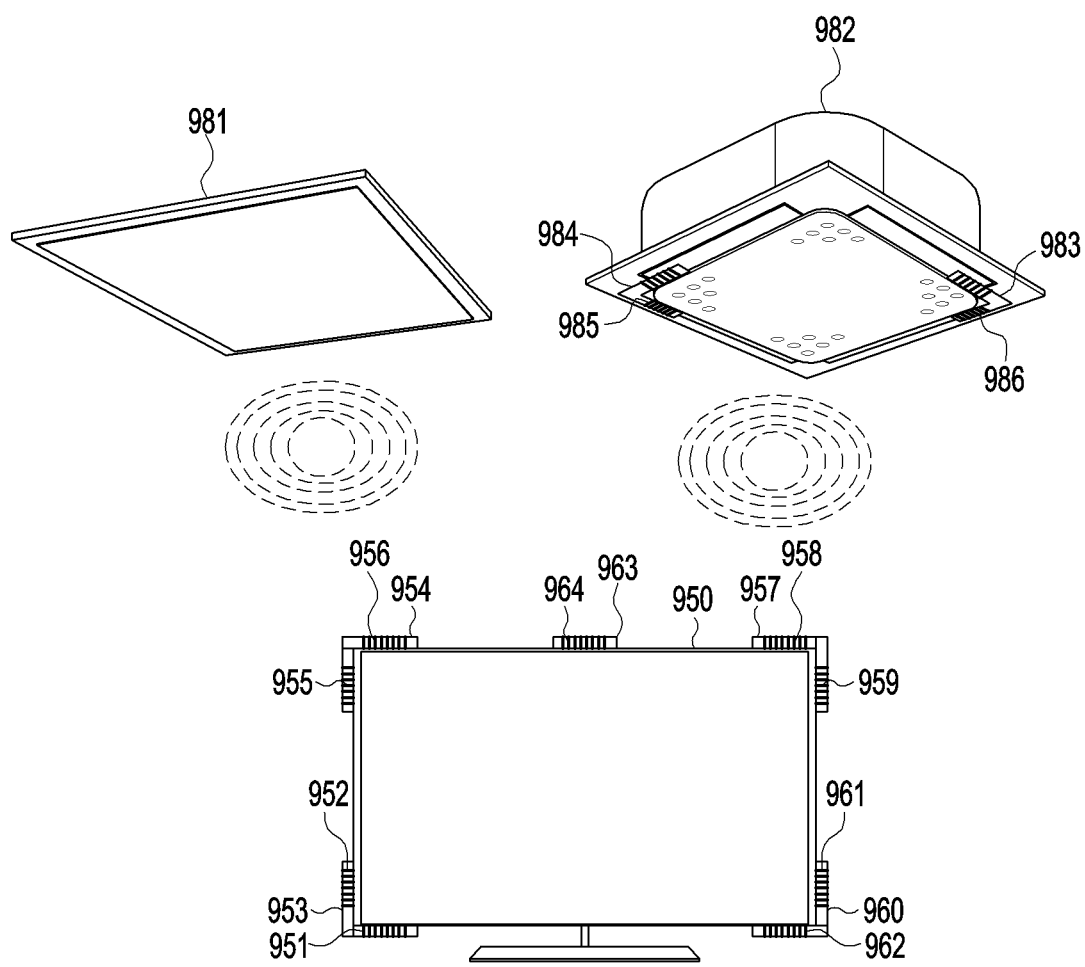

Referring to FIG. 9C, a fifth wireless power transmitter 981 and a sixth wireless power transmitter 982 are added. For example, the fifth wireless power transmitter 981 and the sixth wireless power transmitter 982 are arranged on the ceiling of a room.

The sixth wireless power transmitter 982 includes L-shaped cores 983 and 984 and coils 985 and 986. The core 963 extending in the first direction is positioned on an upper edge of the housing of the electronic device 950. The coil (964)-wound core 963 may detachably be provided in the electronic device 950. Thus, the user may install the core 963 on the upper edge of the housing of the electronic device 950, corresponding to where the wireless power transmitters 981 and 982 are positioned on the ceiling.

Although FIG. 9C illustrates the fifth wireless power transmitter 981 as a light fixture, and the sixth wireless power transmitter 982 as an air conditioner, the present disclosure is not limited to a particular implementation.

An induced electromotive force may be generated primarily by the coils 956 and 958 using the magnetic flux from the fifth wireless power transmitter 981 and the sixth wireless power transmitter 982.

Figure 9D:
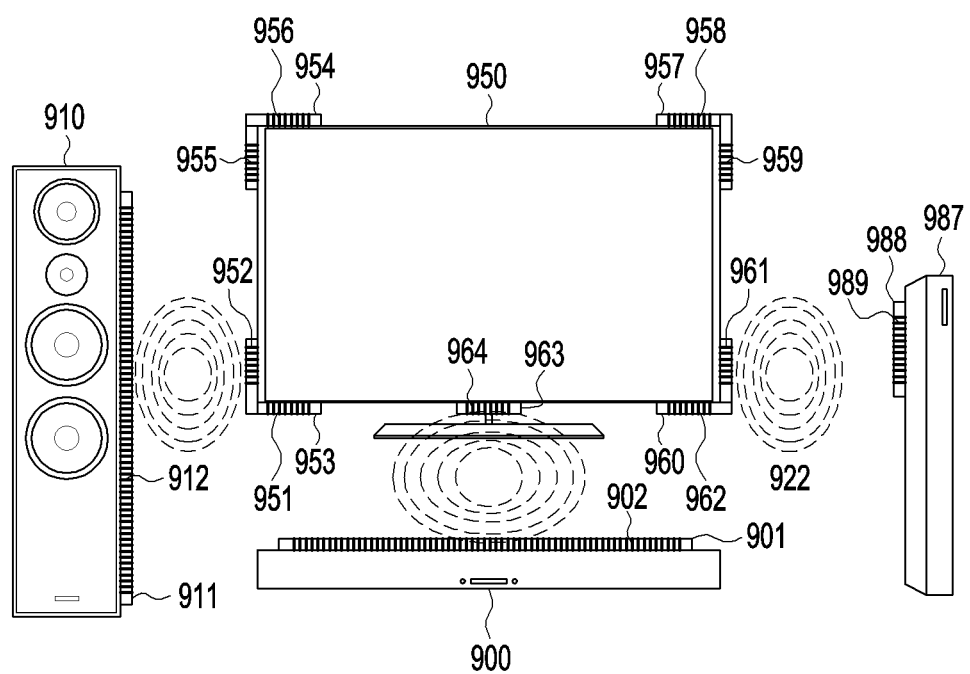

Referring to FIG. 9D, a seventh wireless power transmitter 987, e.g., a media modem, is added. A coil 989 is wound around a core 988 in the seventh wireless power transmitter 987. An induced electromotive force may be generated primarily by the coil 961 using the magnetic flux generated from the coil 989.

Figure 9E:
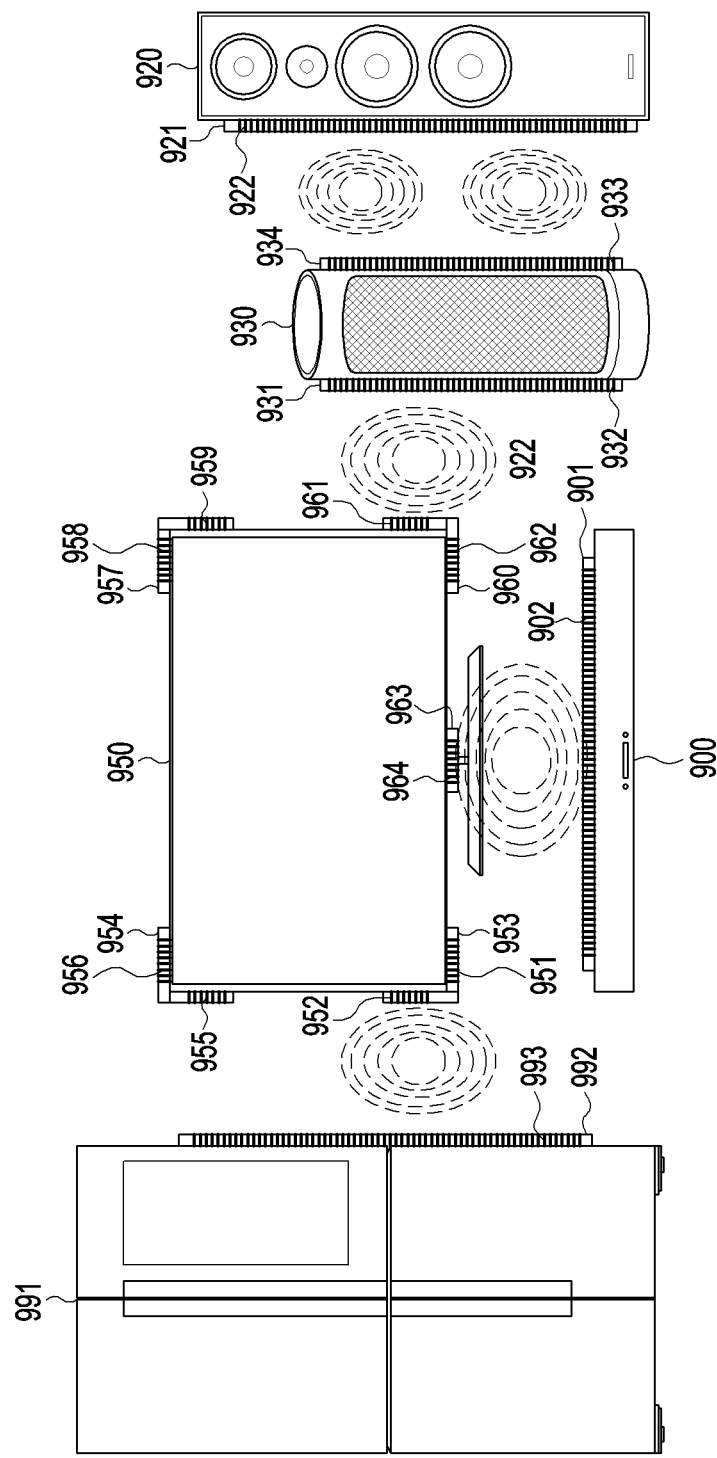

Referring to FIG. 9E, the electronic device may receive power from an eighth wireless power transmitter 991, e.g., a refrigerator. The eighth wireless power transmitter 991 includes a core 992 around which a coil 993 has been wound. An induced electromotive force may be generated primarily by the coils 952 and 955 using the magnetic flux generated from the coil 993.

The third wireless power transmitter 920 may transmit power to a ninth wireless power transmitter 930, e.g., an air purifier. The ninth wireless power transmitter 930 includes cores 931 and 934 and coils 932 and 933 wound around the cores 931 and 934. The coil 933 of the ninth wireless power transmitter 930 may generate an induced electromotive force using the magnetic flux formed from the coil 922. The coil 932 included in the ninth wireless power transmitter 930 may produce magnetic flux using the received power. The coil 961 of the electronic device 950 may primarily generate an induced electromotive force using the magnetic flux. The ninth wireless power transmitter 930 may operate as a relay that retransmits the received power.

Figure 10A:
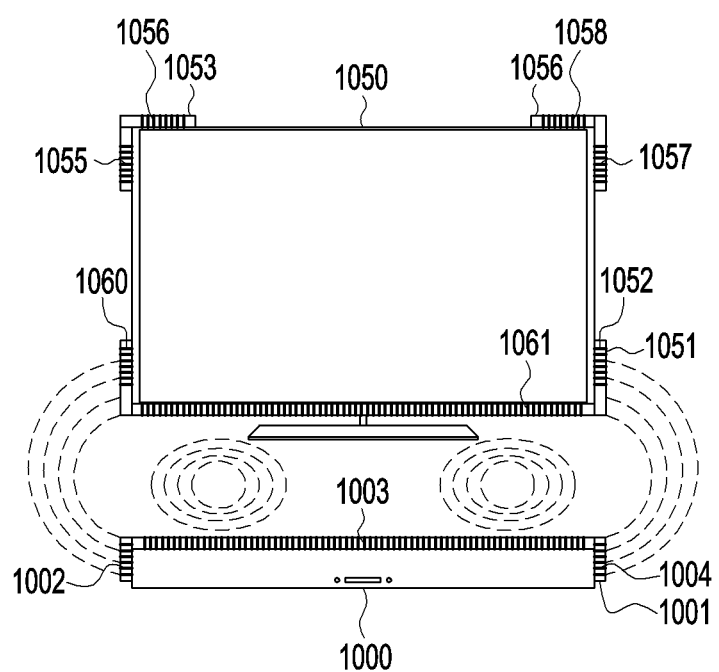
FIGS. 10A and 10B illustrates coils according to an embodiment.
Figure 10B:
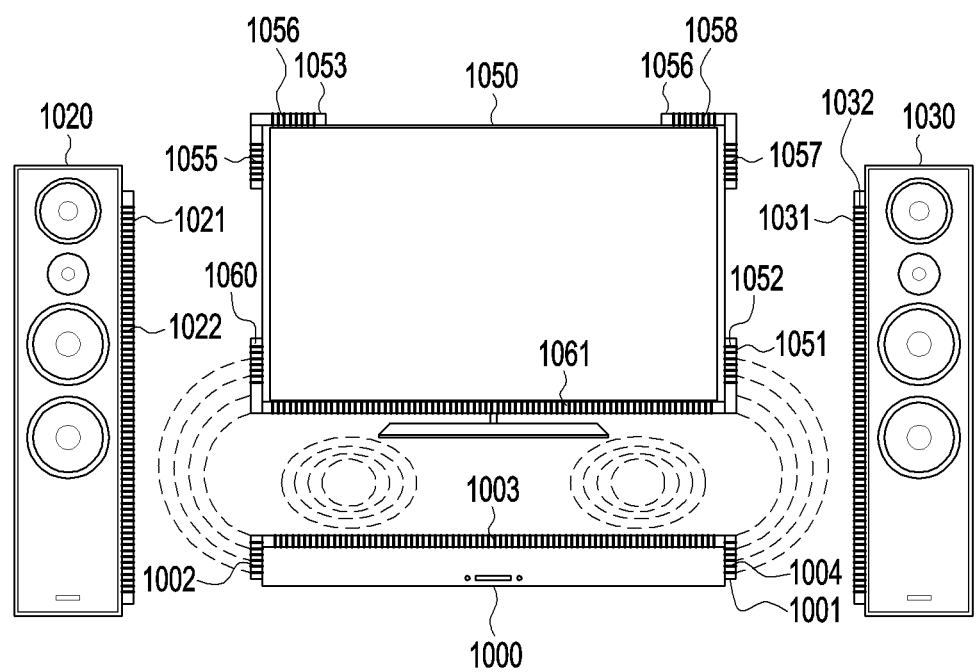

FIGS. 10A and 10B illustrate coils according to an embodiment.

Referring to FIG. 10A, an electronic device 1050 includes a U-shaped core 1051 and L-shaped cores 1053 and 1058. The U-shaped core 1051 includes a first portion extending in the first direction and a second portion and third portion extending in the second direction. The second portion and the third portion are connected to both ends of the first portion. A coil 1061, a coil 1060, and a coil 1052, respectively, are wound around the first portion, the second portion, and the third portion in the first, second, and third directions, respectively. The coils 1054 and 1055 are wound around the L-shaped core 1053 in directions substantially perpendicular to each other. The coils 1056 and 1057 are wound around the L-shaped core 1058 in directions substantially perpendicular to each other.

The wireless power transmitter 1000 includes a U-shaped core 1001. The U-shaped core 1001 includes a first portion extending in the first direction and a second portion and third portion extending in the second direction. The second portion and the third portion are connected to both ends of the first portion. A coil 1003, a coil 1002, and a coil 1004 are wound around the first portion, the second portion, and the third portion, respectively, in the first, second, and third directions, respectively. The coils 1002, 1003, and 1004 may generate magnetic flux. The coils 1052, 1060, and 1061 may produce an induced electromotive force using the magnetic flux formed from the coils 1002, 1003, and 1004. The coils 1002, 1003, 1004, 1052, 1060, and 1061 may be wound around the U-shaped cores 1001 and 1051 diminish winding losses.

Referring to FIG. 10B, other wireless power transmitters 1020 and 1030 are added, which include cores 1021 and 1031, respectively, and coils 1022 and 1032 wound around the cores 1021 and 1031, respectively. The coils 1052 and 1060 may generate an induced electromotive force using the magnetic flux formed from the coils 1022 and 1032.

Figure 11A:
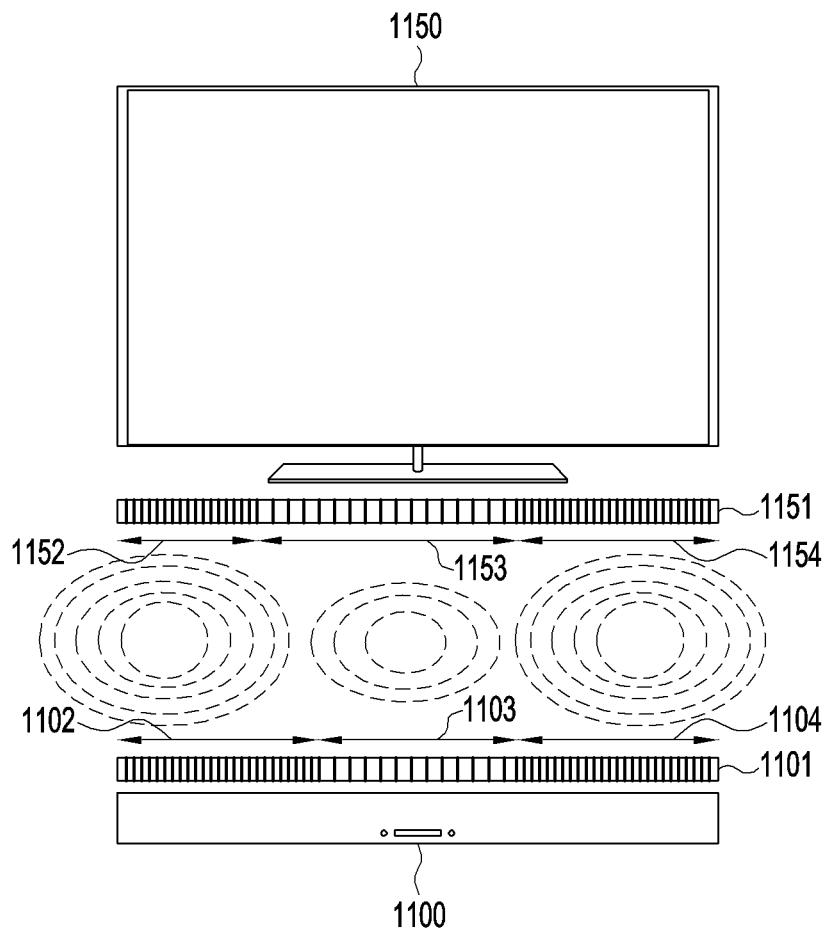
FIGS. 11A and 11B illustrate a wireless power transmitter and an electronic device according to an embodiment.
Figure 11B:
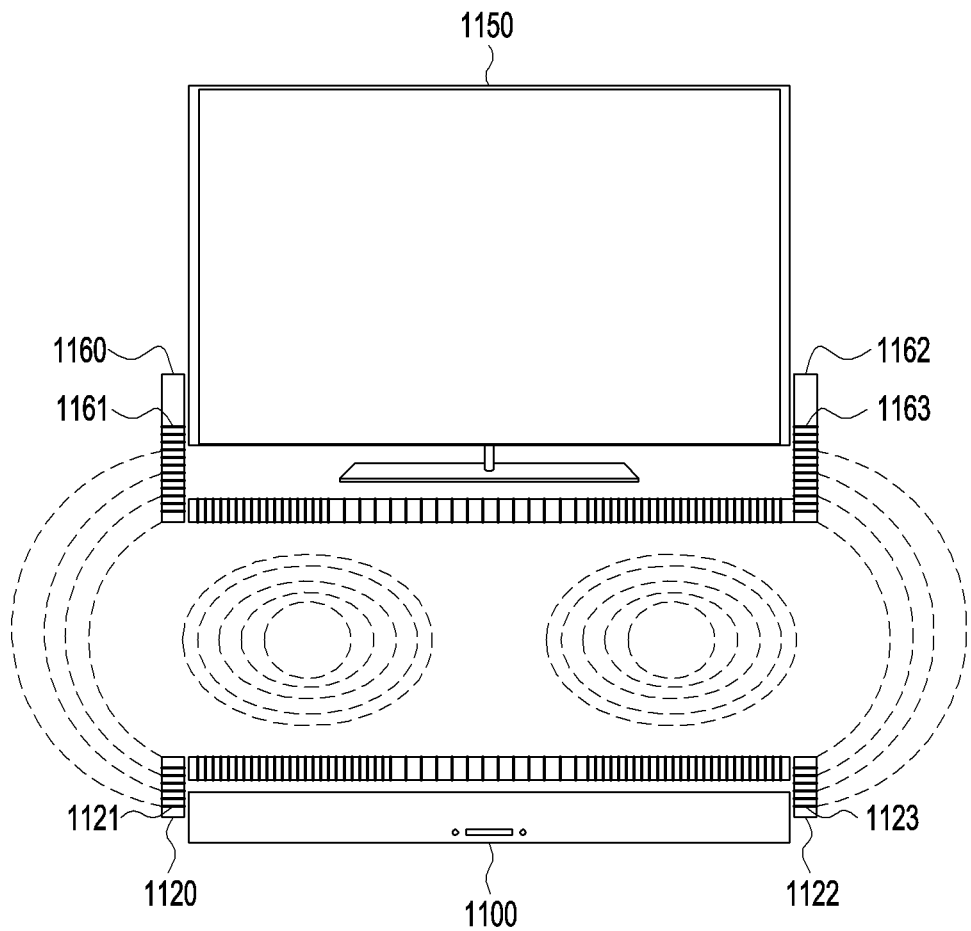

FIGS. 11A and 11B illustrate coils of a wireless power transmitter and an electronic device according to an embodiment.

Referring to FIG. 11A, a wireless power transmitter 1100 includes a core 1101 extending in the first direction. A first coil 1102, a second coil 1103, and a third coil 1104 are wound around the core 1101 in a first interval, a second interval, and a third interval, respectively. The first coil 1102, the second coil 1103, and the third coil 1104 may be connected in series with each other.

An electronic device 1150 includes a core 1151 extending in the first direction. A fourth coil 1152, a fifth coil 1153, and a sixth coil 1154 are wound around the core 1151 in a fourth interval, a fifth interval, and a sixth interval, respectively. The fourth coil 1152, the fifth coil 1153, and the sixth coil 1154 may be connected in series with each other.

Magnetic flux may be produced from the first coil 1102, the second coil 1103, and the third coil 1104. The fourth coil 1152, the fifth coil 1153, and the sixth coil 1154 may generate an induced electromotive force using the magnetic flux. The second interval may be broader than the first interval or the third interval, and the fifth interval may be broader than the fourth interval or sixth interval. In other words, the wireless power transmitter 1100 and the electronic device 1150 may have coils that are wound relatively broader in their middle portions and relatively narrower in their side ends which are away from the middle portions. Thus, a relatively smaller strength of magnetic flux may be generated from the middle portions of the cores 1101 and 1151, preventing the magnetic material in the middle portions from saturating and hence prolonging the lifespan of the cores.

Referring to FIG. 11B, the wireless power transmitter 1100 may add cores 1120 and 1122 with coil windings 1121 and 1123, creating a U-shaped core. The electronic device 1150 may add cores 1160 and 1162 with coil windings 1161 and 1163, creating a U-shaped core. In the U-shaped cores, the coils may be wound at relatively broad intervals on the middle portion of at least one part of the core. Although not shown, also in the L-shaped core, the coil may be wound at relatively broad intervals on the middle portion of at least one part of the core.

Figure 12:
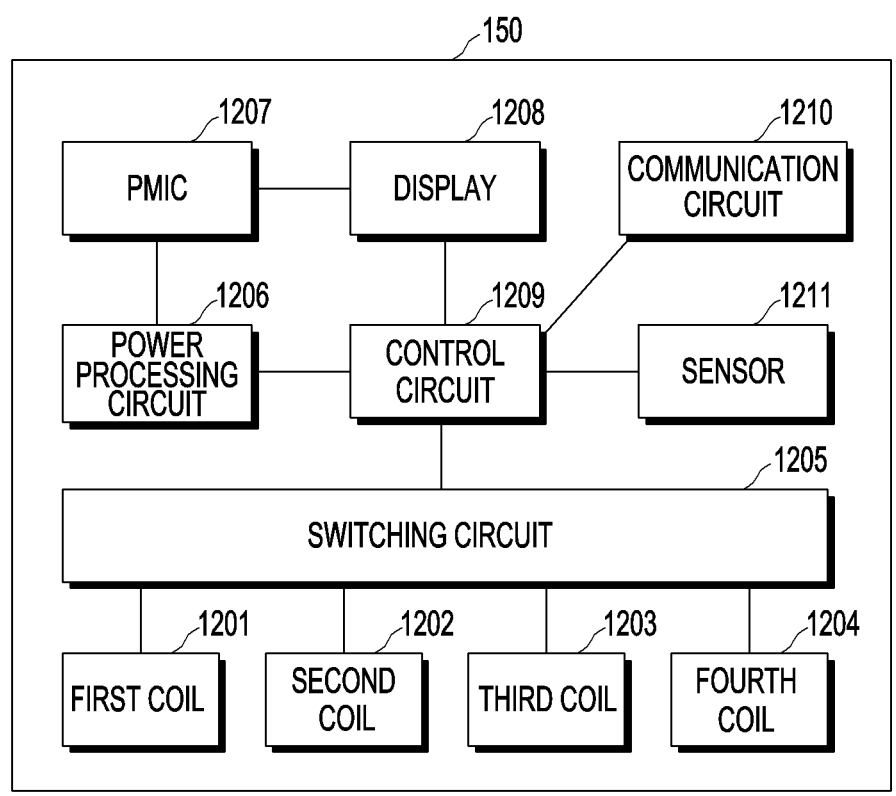
FIG. 12 illustrates an electronic device according to an embodiment.

FIG. 12 illustrates an electronic device according to an embodiment.

Referring to FIG. 12, an electronic device 150 includes power reception coils 1201, 1202, 1203, and 1204, a switching circuit 1205, a power processing circuit 1206, a PMIC 1207, a display 1208, a control circuit 1209, a communication circuit 1210, and a sensor 1211.

The control circuit 1209 may control the switching circuit 1205 to connect at least one of the power reception coils 1201, 1202, 1203, and 1204 to the power processing circuit 1206. For example, the control circuit 1209 may control the switching circuit 1205 to connect the first coil 1201 and the second coil 1202 to the power processing circuit 1206, in which case, the third coil 1203 and the fourth coil 1204 might not connect to the power processing circuit 1205. The control circuit 1209 may control the switching circuit 1205 to connect at least one of the coils 1201, 1202, 1203, and 1204 to the power processing circuit 1206 according to various operations, such as detecting the position of an obstacle within the charging area or an obstacle within the charging area, detecting the position of the wireless power transmitter 100 or testing the wireless power transmission/reception efficiency. For example, the control circuit 1209 may determine the position of an obstacle, e.g., a person or an animal, in the charging area or the position of the wireless power transmitter 100 based on data from the sensor 1211.

The sensor 1211 may sense data about an area around the electronic device 150. The control circuit 1209 may determine whether an obstacle appears in the ambient area or the position of the wireless power transmitter using the sensed data. The control circuit 1209 may receive sensed data through the communication circuit 1210 from another sensor that senses data about the ambient area. The sensor 1211 may include various types of sensors that are able to sense data to detect the appearance of an obstacle or the wireless power transmitter 100 and may be implemented in various forms, such as a communication circuit, camera, proximity sensor, or ultrasonic wave sensor.

The control circuit 1209 may detect the appearance of an obstacle in the ambient area using the sensed data, and based thereupon, determine at least one of the coils 1201, 1202, 1203, and 1204 to connect to the power processing circuit 1206. The control circuit 1209 may determine the position of the wireless power transmitter 100 using the sensed data, and based thereupon, determine at least one of the coils 1201, 1202, 1203, and 1204 to connect to the power processing circuit 1206.

The control circuit 1209 may control the switching circuit 1205 to sequentially connect various combinations of the first coil 1201, second coil 1202, third coil 1203, and fourth coil 1204 to the power processing circuit 1206 according to various operations, such as testing the wireless power transmission/reception efficiency.

The power processing circuit 1206 may rectify power input from the connected coil and may additionally convert the voltage of the rectified power. When each of the coils 1201, 1202, 1203, and 1204 is connected, the control circuit 1209 may detect at least one of the voltage or current at, at least, a portion of the power processing circuit 1206.

The electronic device 150 may also include a current/voltage sensor capable of measuring the voltage or current at, at least, a portion of the power processing circuit 1206, and the control circuit 1209 may determine the magnitude of power entered from the connected coil based on sensing data from the current/voltage sensor.

The control circuit 1209 may control the switching circuit 1205 to connect at least one of the coils 1201, 1202, 1203, and 1204 to provide the largest magnitude of power to be received to the power processing circuit 1206.

The control circuit 1209 may sequentially connect the first coil 1201, the second coil 1202, the third coil 1203, and the fourth coil 1204 to the power processing circuit 1206 and measure the magnitude of power input from the connected coil. The control circuit 1209 may determine the position of the wireless power transmitter 100 based on the magnitude of power and determine a coil combination for later power transmission corresponding to the position of the wireless power transmitter 100.

Figure 13:
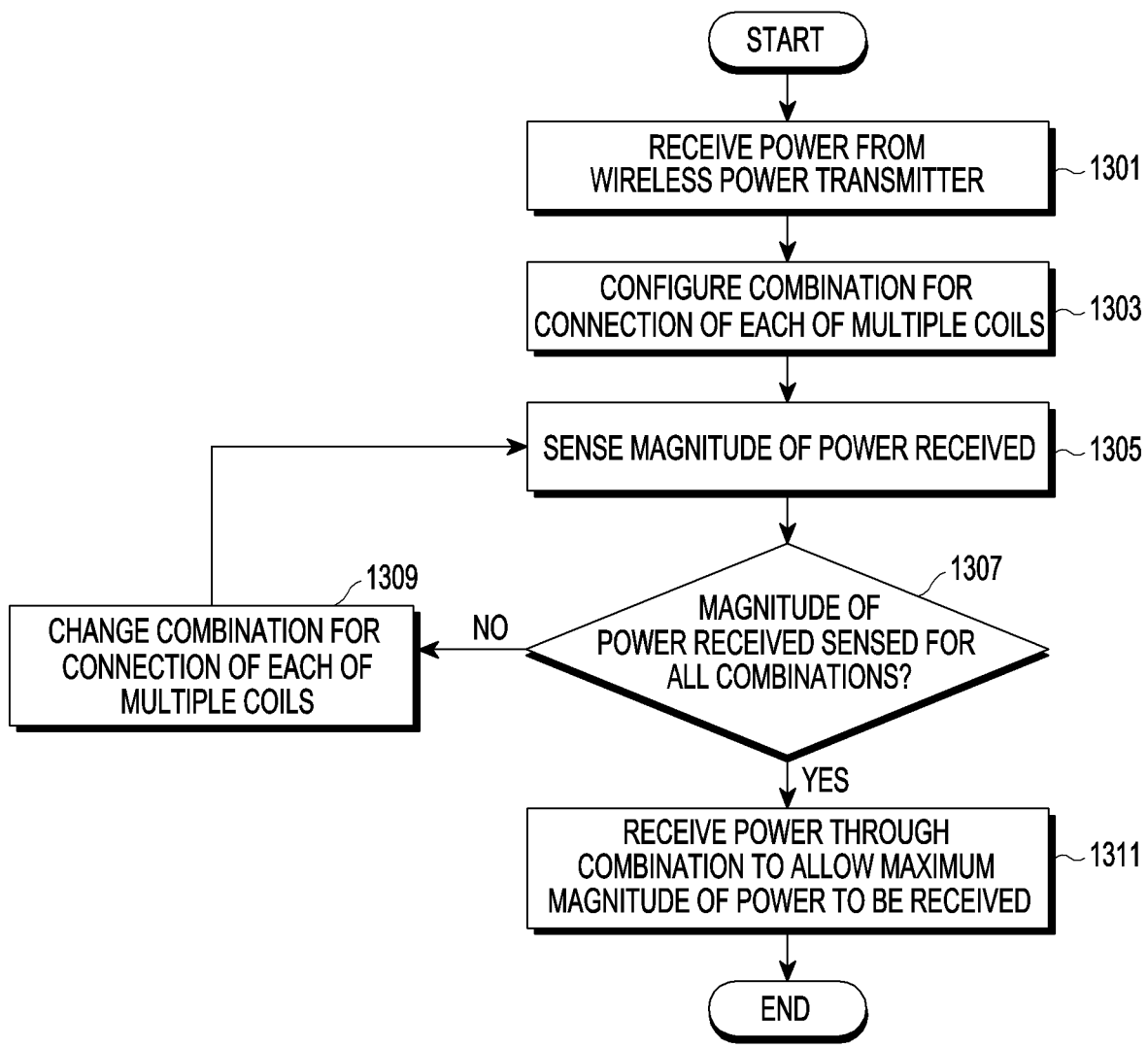
FIG. 13 is a flowchart illustrating a method for operating an electronic device according to an embodiment.

FIG. 13 is a flowchart illustrating a method for operating an electronic device according to an embodiment.

Referring to FIG. 13, in step 1301, the electronic device 150 receives power from the wireless power transmitter 100.

In step 1303, the electronic device 150 configures combinations a plurality of coils to be connected and controls the configured combinations of the coils to be connected to the power processing circuit.

In step 1305, the electronic device 150 senses the magnitude of power received (e.g., the magnitude of current or voltage at, at least, one point of the power processing circuit).

In step 1307, the electronic device 150 determines whether the magnitude of power received has been sensed for all of the combinations. Unless the magnitude of power has been sensed for all of the combinations, the electronic device 150 changes the combination of the connection of the plurality of coils in step 1309. By the above-described process, the electronic device 150 may measure the magnitude of power received for all of the combinations of the plurality of coils.

After the magnitude of power has been received for all of the combinations of the plurality of coils, the electronic device 150 receives power through the combination that presents the largest magnitude of receive power in step 1311.

For example, the magnitude of power received may be smaller when the first coil 1201 alone is connected to the power processing circuit 1206 than when the first coil 1201 and the second coil 1202 are connected to the power processing circuit 1206. In this case, the electronic device 150 may interconnect the first coil 1201 and the second coil 1202 and then connect them to the power processing circuit 1206. The electronic device 150 may control the switch between the first coil 1201 and the second 1202 to turn on.

Alternatively, the electronic device 1450 may determine a coil combination given the wireless power transmission/reception efficiency. For example, when a first coil combination gives a greater magnitude of receive power, but a transmission/reception efficiency below a preset threshold, the electronic device 150 may receive power through another coil combination whose transmission/reception efficiency is greater than the threshold.

Figure 14A:
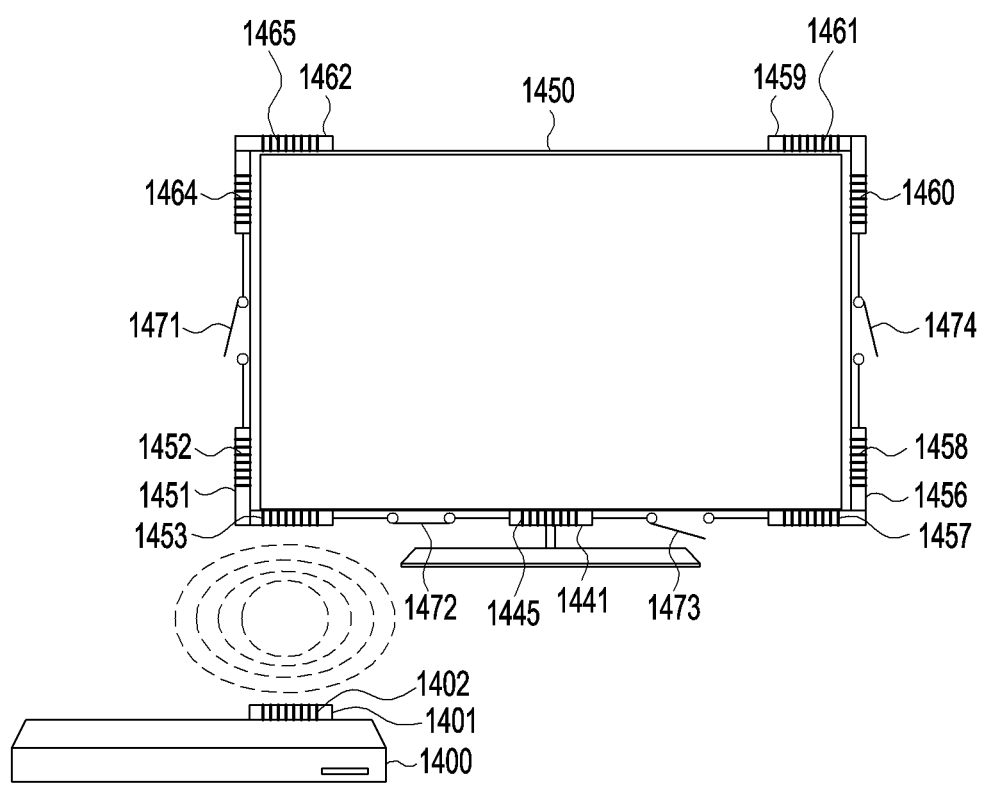
FIGS. 14A to 14C illustrate coil connections according to an embodiment.
Figure 14B:
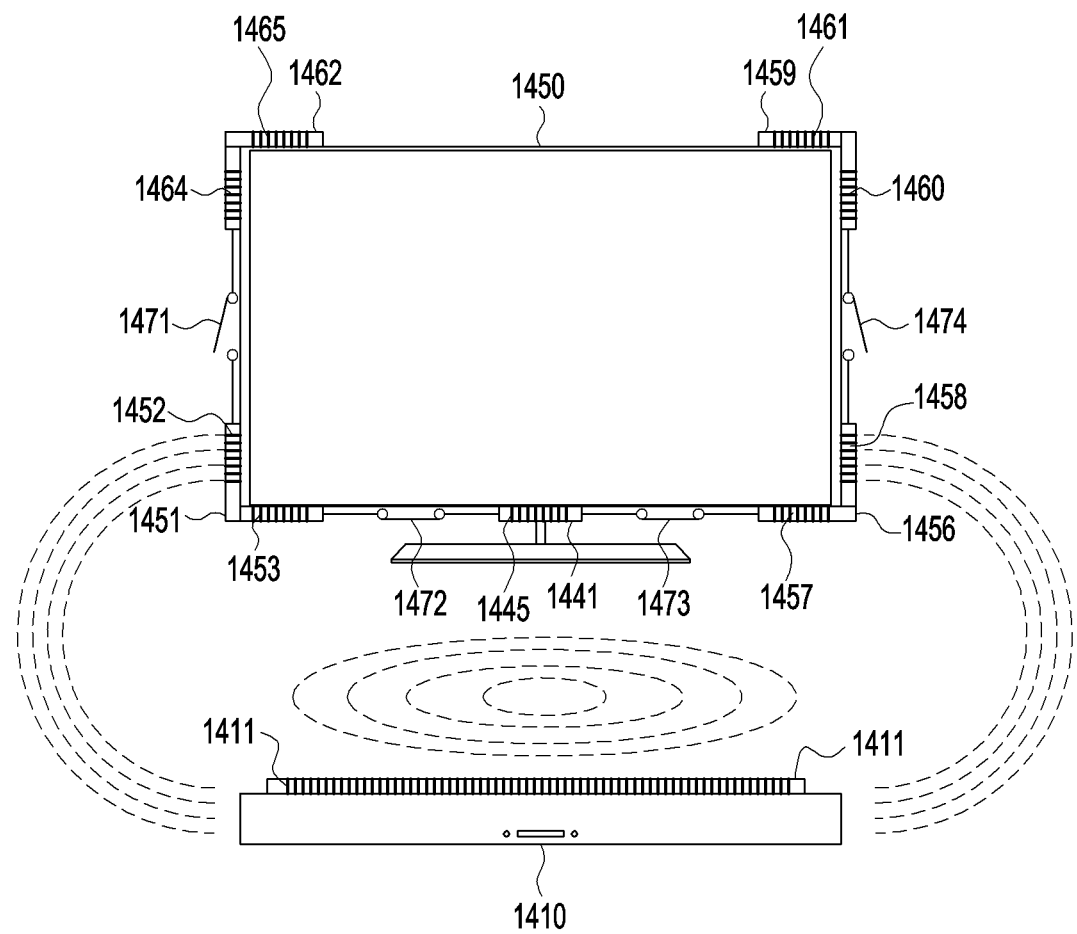
Figure 14C:
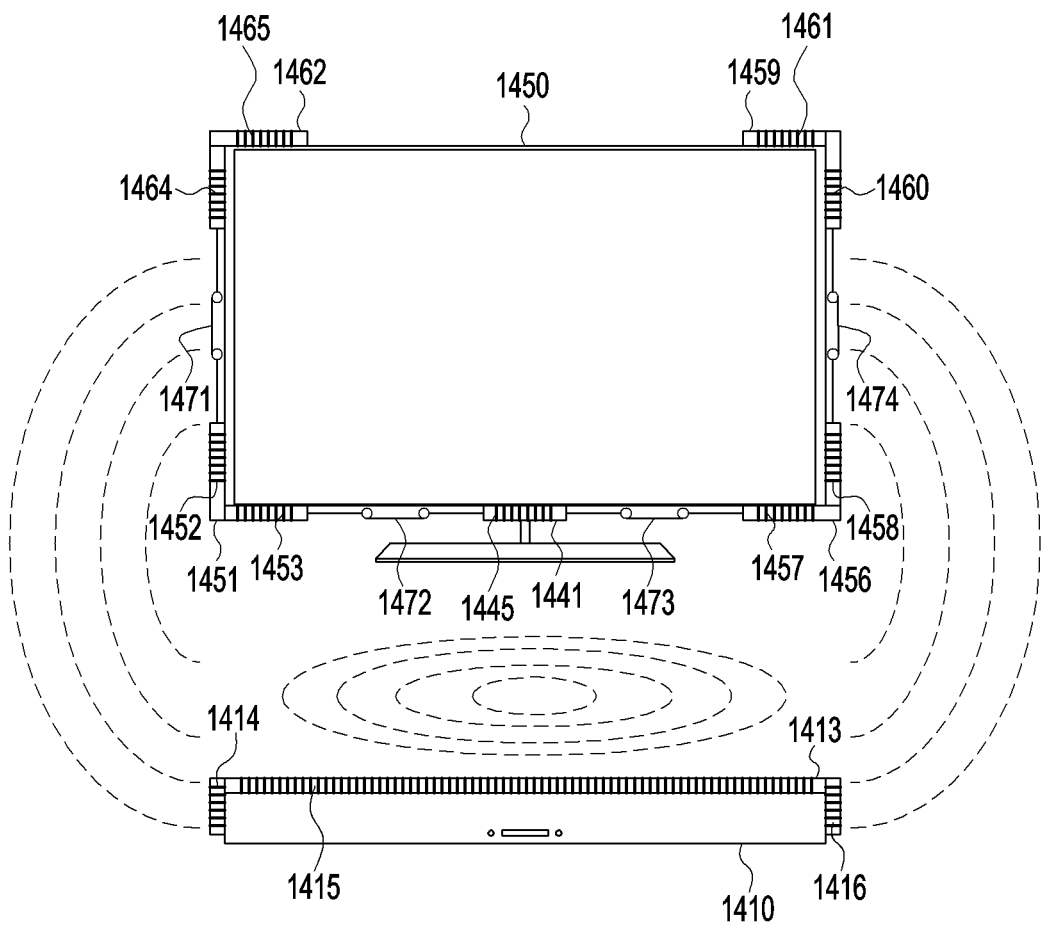

FIGS. 14A to 14C illustrate coil connections according to an embodiment.

Referring to FIG. 14A, a plurality of L-shaped cores 1451, 1456, 1459, and 1462 are arranged on the corner shapes of the housing of the electronic device 1450. A pair of coils 1452 and 1453, a pair of coils 1457 and 1458, a pair of coils 1460 and 1461, and a pair of coils 1465 and 1464 are wound around the L-shaped cores 1451, 1456, 1459, and 1462, respectively. An I-shaped core 1441 is positioned corresponding to the shape of a lower edge of the housing of the electronic device 1450, and a coil 1445 may be wound around the core 1441. The electronic device 1450 may include a switch 1471 for selectively connecting the coil 1464 with the coil 1452, a switch 1472 for selectively connecting the coil 1453 with the coil 1445, a switch 1473 for selectively connecting the coil 1445 with the coil 1457, and a switch 1474 for selectively connecting the coil 1458 with the coil 1460.

The electronic device 1450 may receive power from the wireless power transmitter 1400.

The wireless power transmitter 1400 includes a core 1401 around which a coil 1402 has been wound. An induced electromotive force may be generated primarily by the coils 1453 and 1445 using the magnetic flux generated from the coil 1402. The electronic device 1450 may control the switch 1472 to turn on to connect the coils 1453 and 1445, while turning off the switches 1471, 1473, and 1474 to allow the other coils to disconnect from the power processing circuit. For example, the electronic device 1450 may determine that the coil 1402 of the wireless power transmitter 1400 is positioned relatively at the left.

As described above, the electronic device 1450 may determine the position of the wireless power transmitter 1400 using various types of sensor data or vision recognition. The electronic device 1450 may control the switches 1471, 1472, 1473, and 1474 to form a coil combination corresponding to the determined position of the wireless power transmitter 1400. For example, the electronic device 1450 may control the switch 1472 to turn on while turning off the other switches 1471, 1473, and 1474.

The electronic device 1450 may connect various coil combinations to the power processing circuit and may determine that the combination to allow the largest magnitude of power to be received is the combination of the coils 1453 and 1445 connected together. The electronic device 1450 may control the switch 1472 to turn on to allow power to be received with a coil combination that enables reception of the largest magnitude of power while controlling the other switches 1471, 1473, and 1474 to turn off.

Referring to FIG. 14B, a wireless power transmitter 1410 is positioned at a relatively middle portion of the electronic device 1450. The coil 1412 included in the wireless power transmitter 1410 is relatively longer in length than the coil 1402 of FIG. 14A. The core 1411 may also be longer in length than the core 1401 of FIG. 14A. The electronic device 1450 may determine the position of the wireless power transmitter 1410, and according to a result of the determination, control the switches 1472 and 1473 to turn on while turning off the switches 1471 and 1474. Accordingly, the coils 1452, 1453, 1445, 1457, and 1458 may generate an induced electromotive force using the magnetic flux formed from the coil 1412. As described above, the electronic device 1450 may control the switches to select a coil combination allowing the largest magnitude of power to be received after testing various combinations.

Referring to FIG. 14C, the wireless power transmitter 1410 is positioned at a relatively middle portion of the electronic device 1450, but relatively farther away than in FIG. 14B. The wireless power transmitter 1410 includes a U-shaped core 1413 on which coils 1414, 1415, and 1416 may be wound. The electronic device 1450 may control the switches 1471, 1472, 1473, and 1474 to turn on to connect the coils 1452, 1453, 1445, 1457, 1458, 1460, 1461, 1465, and 1464 using the position of the wireless power transmitter 1410 or the results of testing a plurality of combinations. The coils 1452, 1453, 1445, 1457, 1458, 1460, 1461, 1465, and 1464 may produce an induced electromotive force using the magnetic flux formed from the coils 1414, 1415, and 1416.

Figure 15:
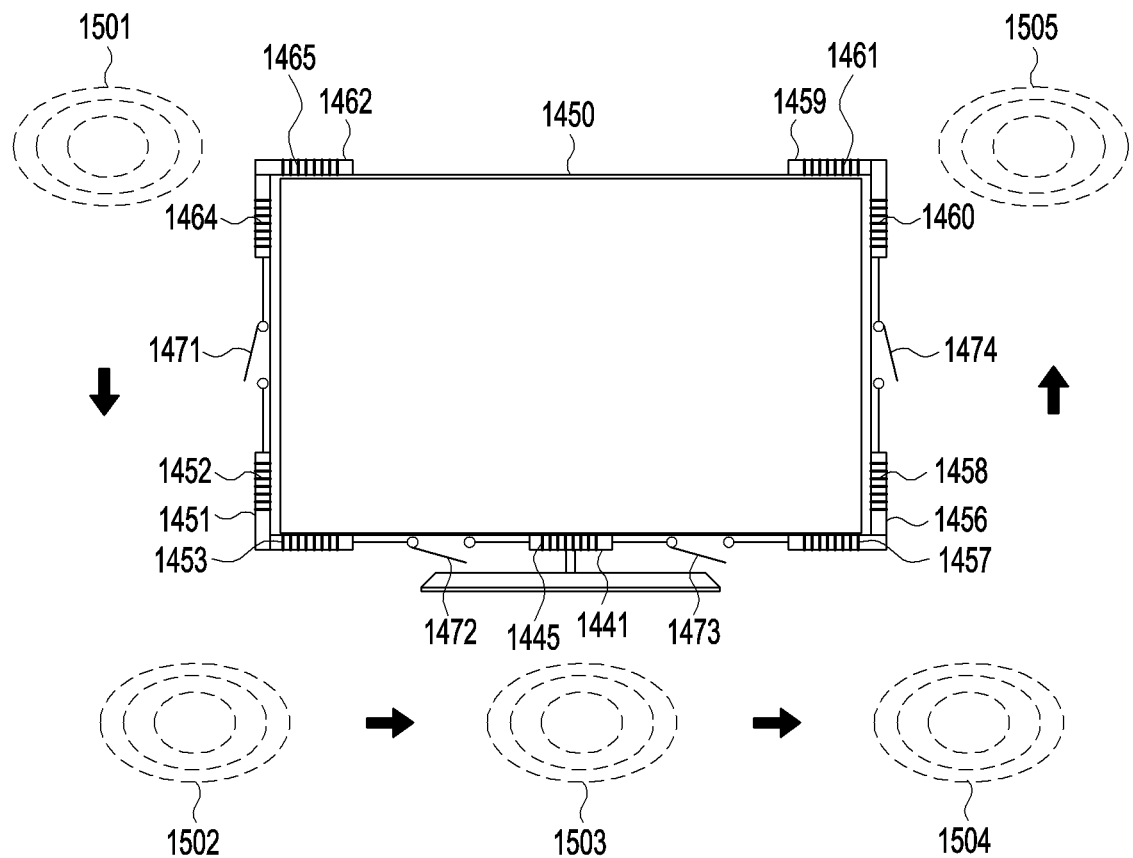
FIG. 15 illustrates coils of a wireless power transmitter and an electronic device according to an embodiment.

FIG. 15 illustrates coils of a wireless power transmitter and an electronic device according to an embodiment.

Referring to FIG. 15, the electronic device 1450 may control the switches 1471, 1472, 1473, and 1474 all to turn off in a standby mode. When the switches 1471, 1472, 1473, and 1474 are turned off, the coils in the electronic device 1450 are disconnected from each other. The electronic device 1450 may connect all of the coils to the power processing circuit or sequentially connect the coils to the power processing circuit.

A wireless power transmitter may perform a detection operation based on a wireless charging scheme. For example, the wireless power transmitter may send a ping signal using a Qi scheme, and the electronic device 1450 may receive the ping signal through at least one of the coils to operate and may perform a subscription operation required for the Qi scheme.

As another example, the wireless power transmitter may send a short beacon signal or long beacon signal using an AFA scheme, and the electronic device 1450 may receive the short beacon signal or long beacon signal through at least one of the coils to operate and may perform a subscription operation required for the AFA scheme. As illustrated in FIG. 15, the electronic device 1450 may sequentially connect the coils to the power processing circuit to detect at least one of the magnetic flux by the ping signal or magnetic flux by the beacon signal.

The electronic device 1450 may include an internal power source. The electronic device 1450 may sequentially generate magnetic flux 1501, 1502, 1503, 1504, and 1505 through the coils. The electronic device 1450 may apply current to each coil to generate the magnetic flux 1501, 1502, 1503, 1504, and 1505 and may measure the impedance using the current or voltage at the coils while applying the current. The electronic device 1450 may detect an obstacle by measuring a variation in the coil impedance. The electronic device 1450 may determine the position of the obstacle based on the position of the coil that has caused the impedance variation.

The wireless power transmitter may determine the position of the obstacle and send a result of the determination to the electronic device, or the wireless power transmitter may determine a combination of switch connections in the electronic device according to a result of determining the position of the obstacle and notify the electronic device 1450 of a result of the determination.

Figure 16:
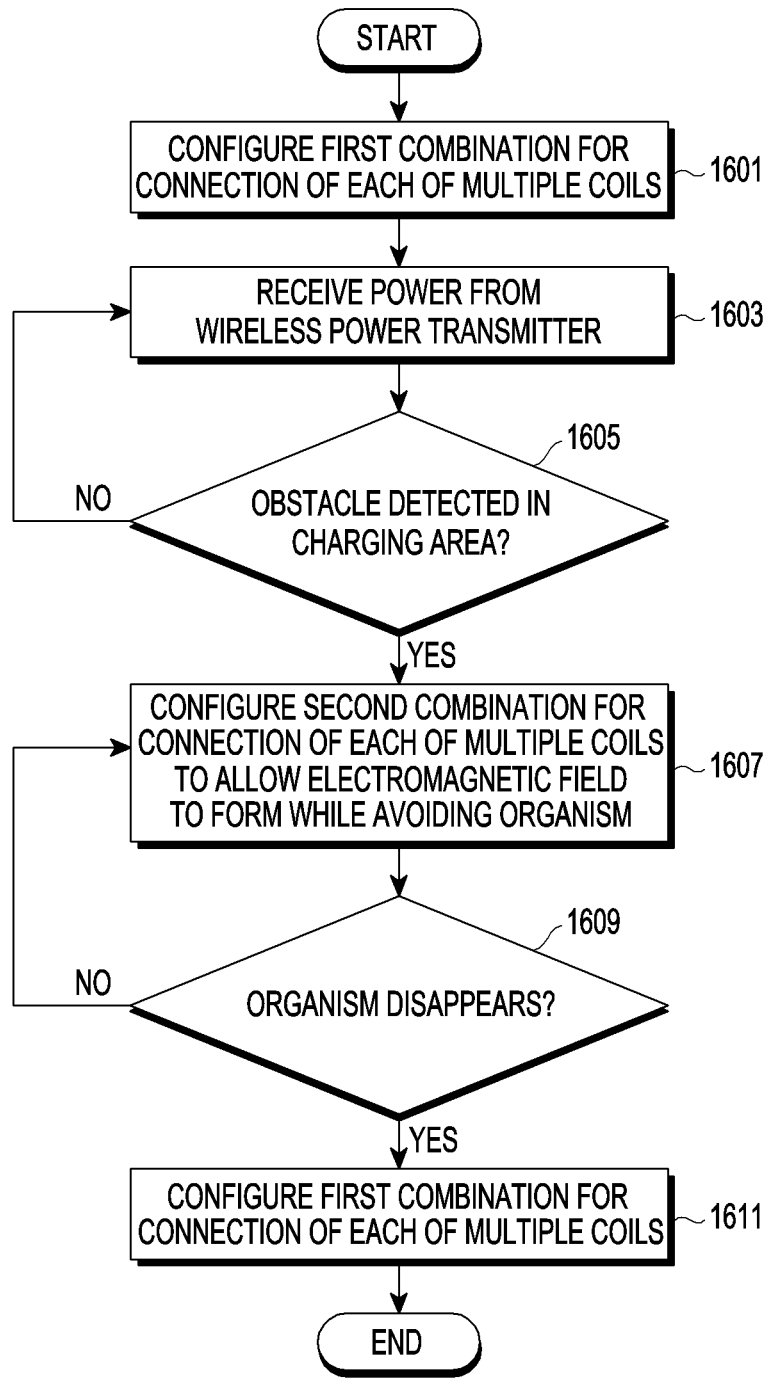
FIG. 16 is a flowchart illustrating a method for operating an electronic device according to an embodiment.

FIG. 16 is a flowchart illustrating a method for operating an electronic device according to an embodiment.

Referring to FIG. 16, in step 1601, the electronic device 150 configures a first combination for connections of a plurality of coils. For example, the electronic device 150 may determine the first combination of coils based on at least one of the position of the wireless power transmitter, the magnitude of power received, or the wireless power transmission/reception efficiency.

In step 1603, the electronic device 150 receives power from the wireless power transmitter.

In step 1605, the electronic device 150 determines whether an obstacle is detected in the charging area. For example, the electronic device 150 may determine whether a person or an animal is detected in the area around the electronic device 150 through various sensors.

In step 1607, the electronic device 150 may configure a second combination for connections of the plurality of coils to generate an electromagnetic field while avoiding the obstacle. The electronic device 150 may previously store correlation information between the position of the obstacle and combinations of the plurality of coils, and may determine the second combination by comparing the detected position of the obstacle with the correlation information.

In step 1609, the electronic device 150 determines whether the obstacle departs from the charging area.

Upon determining that the obstacle departs out of the charging area, the electronic device 150 configures the first combination for connections for the plurality of coils in step 1611.

Figure 17A:
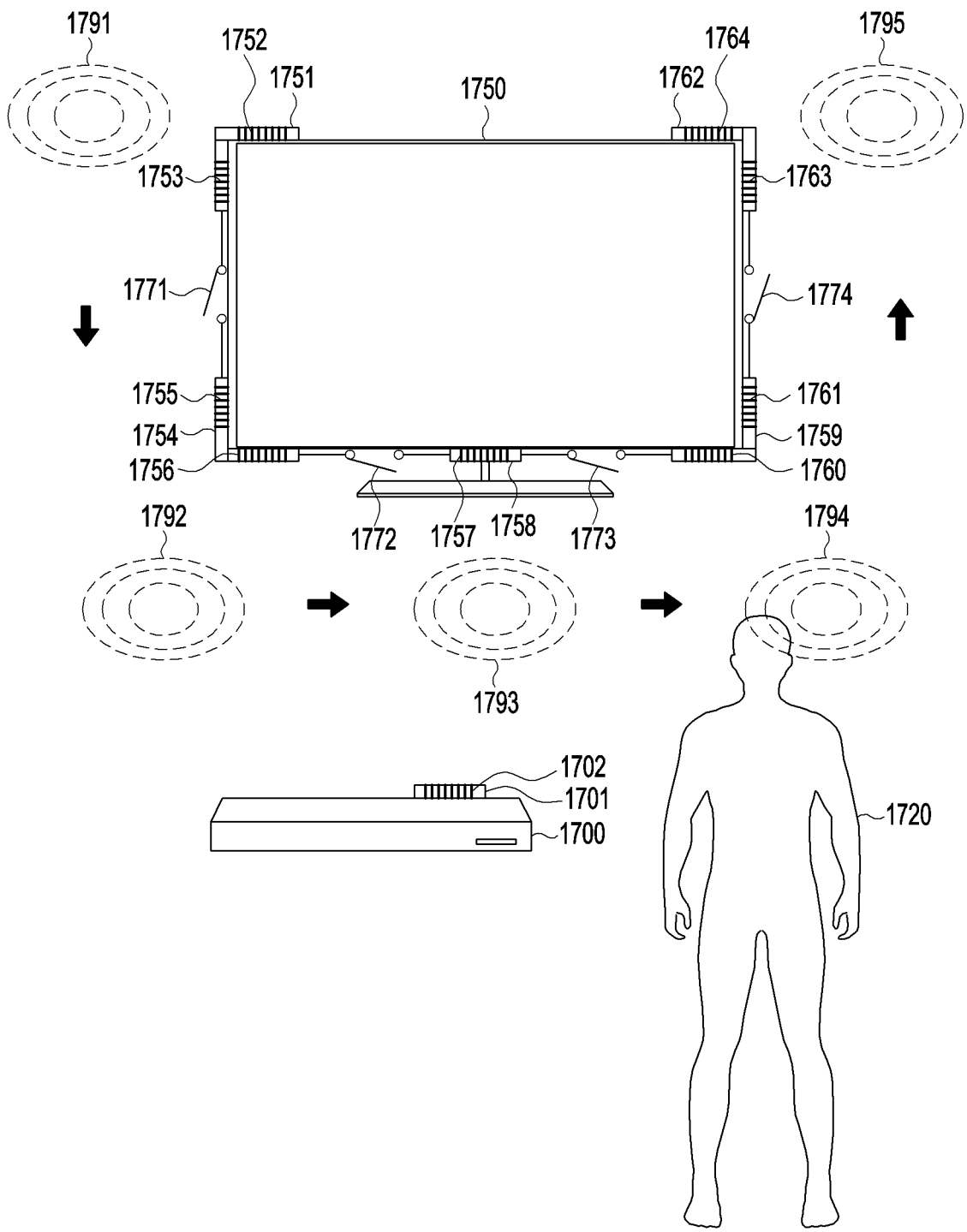
FIGS. 17A and 17B illustrate an electronic device and a wireless power transmitter according to an embodiment.
Figure 17B:
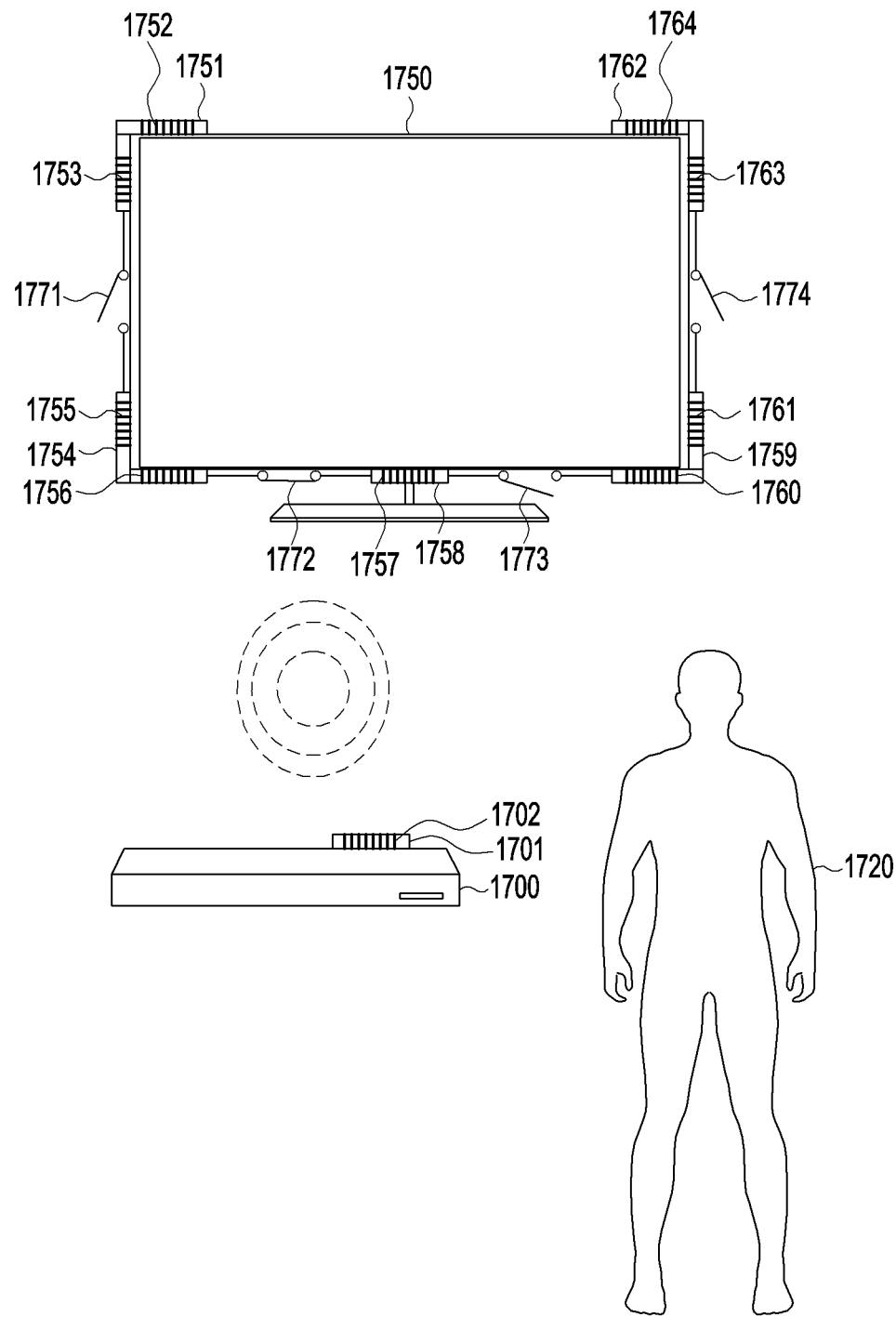

FIGS. 17A and 17B illustrate an electronic device and a wireless power transmitter according to an embodiment.

Referring to FIG. 17A, an electronic device 1750 includes a plurality of L-shaped cores 1751, 1754, 1759, and 1762 and an I-shaped core 1758. A pair of coils 1752 and 1753, a pair of coils 1755 and 1756, a pair of coils 1760 and 1761, and a pair of coils 1763 and 1764 are wound around the L-shaped cores 1751, 1756, 1759, and 1762, respectively. The electronic device 1750 includes an I-shaped core 1758 around which a coil 1757 has been wound. The electronic device 1750 includes a switch 1771 for selectively connecting the coil 1753 with the coil 1755, a switch 1772 for selectively connecting the coil 1756 with the coil 1757, a switch 1774 for selectively connecting the coil 1757 with the coil 1760, and a switch 1774 for selectively connecting the coil 1761 with the coil 1763.

The wireless power transmitter 1700 includes a core 1701 around which a coil 1702 has been wound. The coil 1702 may produce the magnetic flux.

The electronic device 1750 may control the switches 1771, 1772, 1773, and 1774 to turn on, thus connecting all of the coils 1752, 1753, 1755, 1756, 1758, 1760, 1761, 1763, and 1764 and producing an induced electromotive force using the magnetic flux. The electronic device 1750 may detect a positioning of an obstacle 1720, e.g., a person, in the charging area. The electronic device 1750 may detect the obstacle 1720 through various sensors, or the electronic device 1750 may detect the position of the obstacle 1720 according to a variation in the magnitude of power received from at least one of the coils 1752, 1753, 1755, 1756, 1758, 1760, 1761, 1763, and 1764.

For example, as illustrated in FIG. 17A, the obstacle 1720 may be positioned at the right side of the electronic device 1750. In this case, the magnitude of power received through the coils 1760 and 1761 may reduce, and the electronic device 1750 may determine the position of the obstacle 1720 according to the variation in the magnitude of power.

The electronic device 1750 may include an internal power source. The electronic device 1750 may sequentially generate magnetic flux 1791, 1792, 1793, 1794, and 1795 using the internal power source. The electronic device 1750 may apply current to each coil to generate the magnetic flux 1791, 1792, 1793, 1794, and 1795 and may measure the impedance using the current or voltage at the coils while applying the current. The electronic device 1750 may detect an obstacle by measuring a variation in the coil impedance.

The electronic device 1750 may determine the position of the obstacle 1720 based on the position of the coil that has caused the impedance variation.

The electronic device 1750 may determine a coil combination to produce electromagnetic fields while avoiding the obstacle 1720 based on the position of the obstacle 1720.

For example, as illustrated in FIG. 17B, the electronic device 1750 may control the switch 1772 to turn on while turning off the switches 1771, 1773, and 1774. Accordingly, the magnetic flux may be produced primarily between the coils 1756 and 1758 and the coil 1702, preventing the magnetic flux from penetrating into the obstacle 1720.

FIGS. 18A to 18D illustrate a wireless power transmitter and an electronic device according to an embodiment.

Figure 18A:
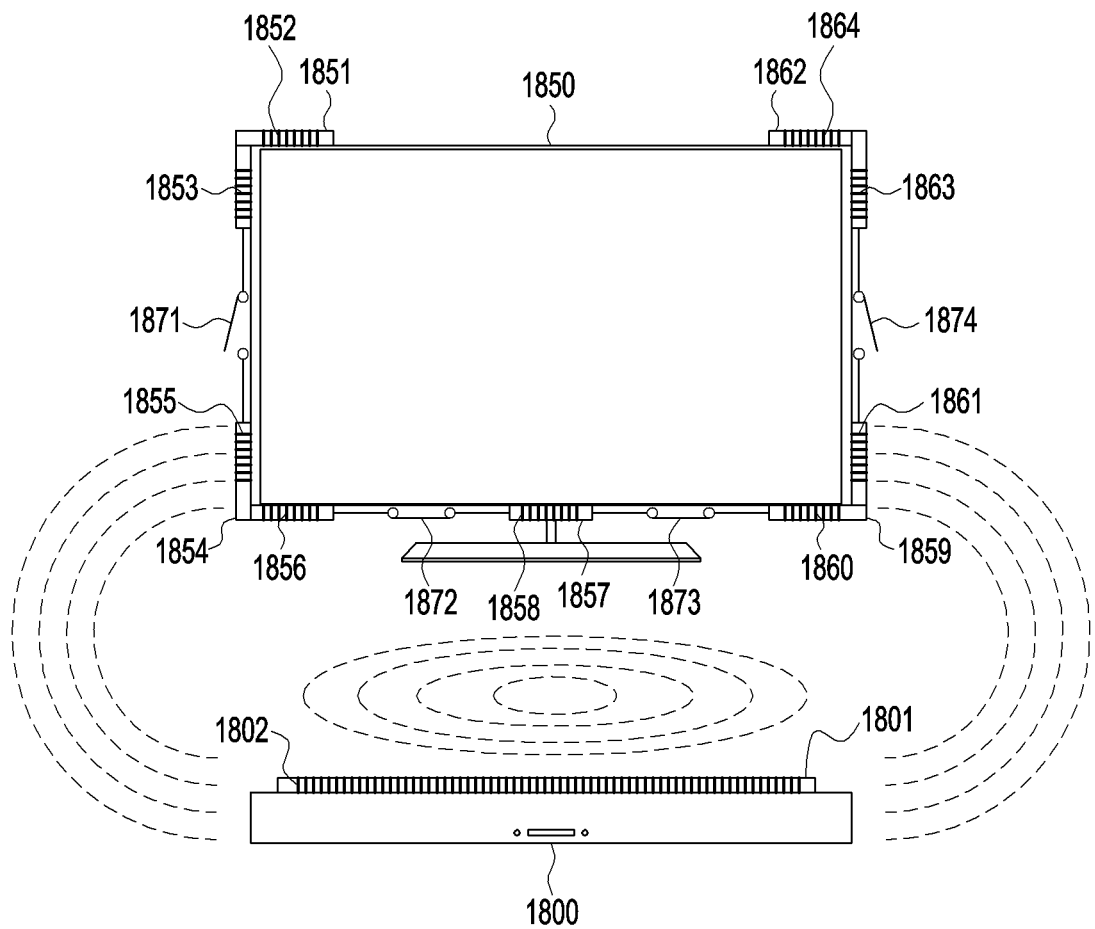
FIGS. 18A to 18D illustrate a wireless power transmitter and an electronic device according to an embodiment.

Referring to FIG. 18A, an electronic device 1850 includes L-shaped cores 1851, 1854, 1859, and 1862 and an I-shaped core 1857. A pair of coils 1852 and 1853, a pair of coils 1855 and 1856, a pair of coils 1860 and 1861, and a pair of coils 1863 and 1864 are wound around the L-shaped cores 1851, 1854, 1859, and 1862, respectively. The electronic device 1850 also includes an I-shaped core 1857 around which a coil 1858 has been wound.

The electronic device 1850 includes a switch 1871 for selectively connecting the coil 1853 with the coil 1855, a switch 1872 for selectively connecting the coil 1856 with the coil 1858, a switch 1874 for selectively connecting the coil 1857 with the coil 1860, and a switch 1874 for selectively connecting the coil 1861 with the coil 1863.

The wireless power transmitter 1800 includes a core 1801 around which a coil 1802 has been wound. The coil 1802 may produce the magnetic flux. The electronic device 1850 may control the switches 1872 and 1873 to turn on, while turning off the switches 1871 and 1874. Accordingly, the coils 1855, 1856, 1858, 1860, and 1861 are connected to produce an induced electromotive force using the magnetic flux.

Figure 18B:
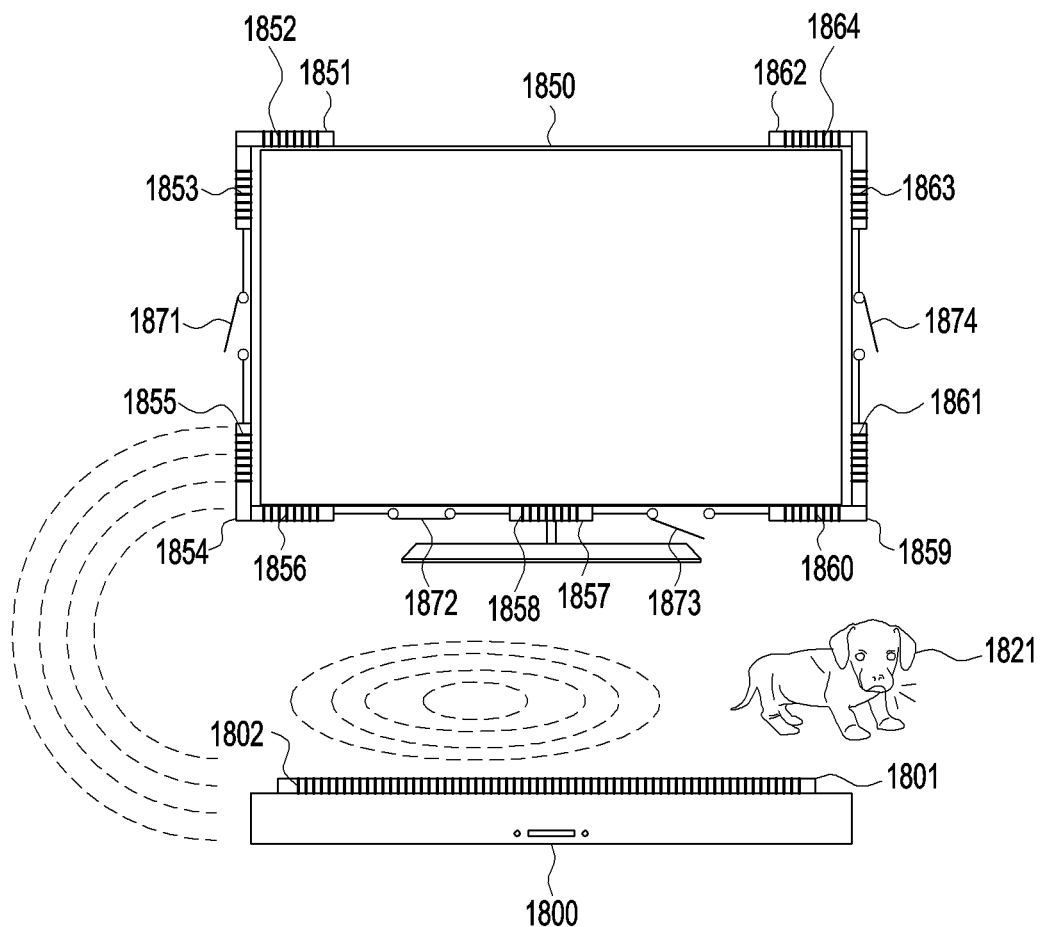

Referring to FIG. 18B, the electronic device 1850 may detect an obstacle 1821, e.g., a pet, and determine the position of the obstacle 1821. The electronic device 1850 may switch the state of the switch 1873 from on to off based on the position of the obstacle 1821. Accordingly, the obstacle 1821 may be prevented from being affected by the magnetic flux.

Figure 18C:
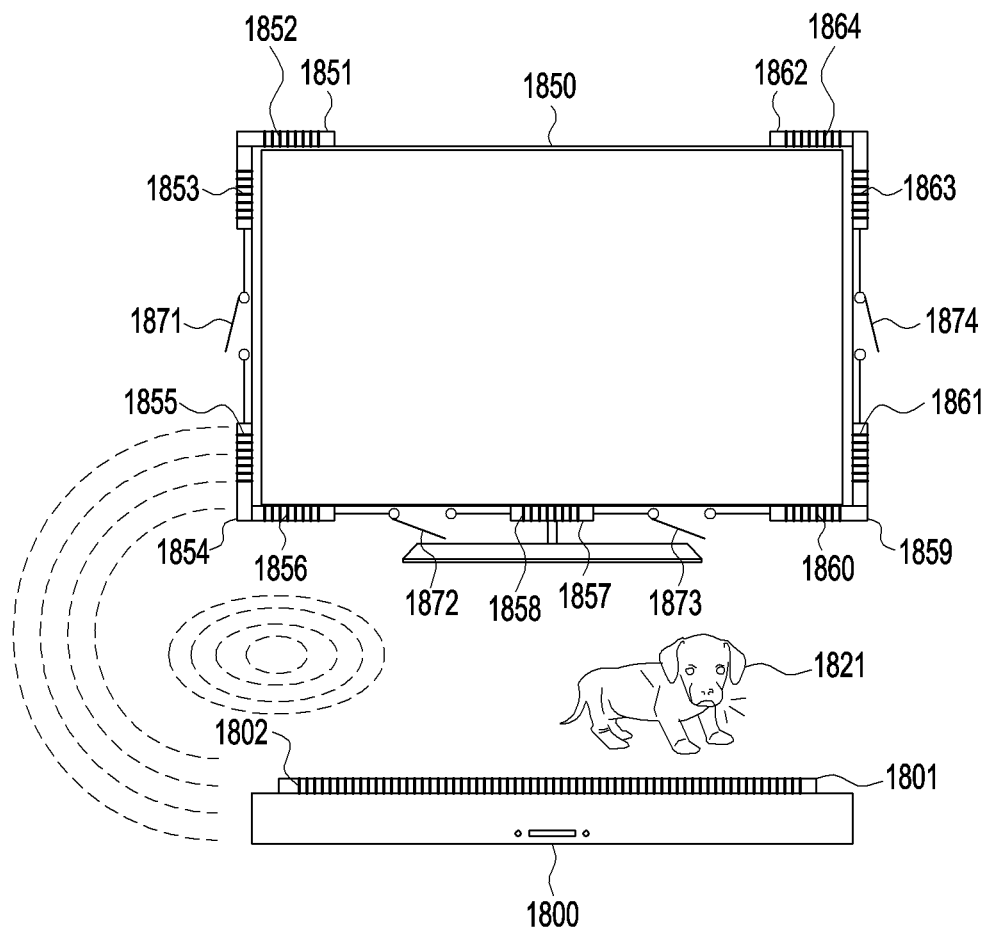

Referring to FIG. 18C, the electronic device 1850 may detect a movement of the obstacle 1821. The electronic device 1850 may switch the state of the switch 1872 from on to off based on the updated position of the obstacle 1821. Accordingly, the obstacle 1821 may be prevented from being affected by the magnetic flux.

Figure 18D:
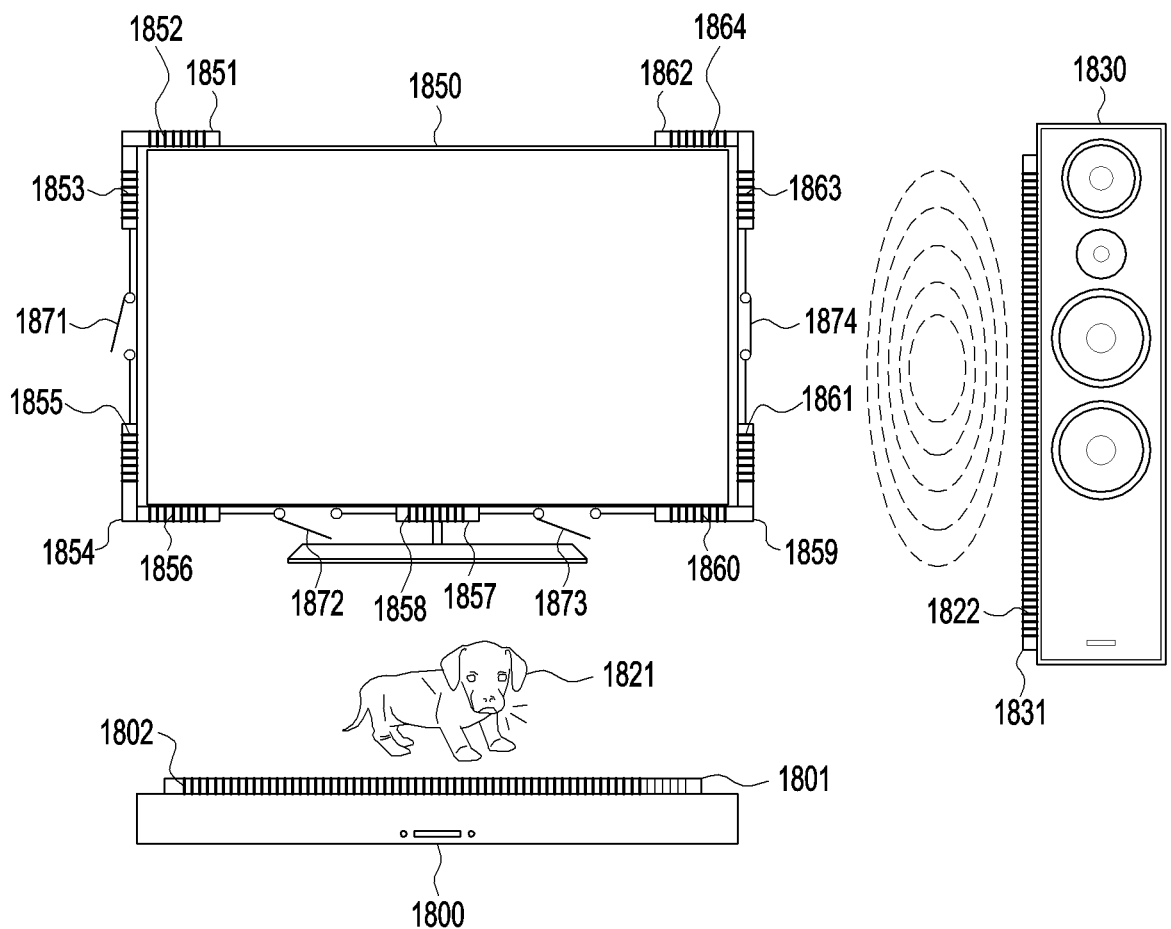

When the obstacle 1821 moves, e.g., as illustrated in FIG. 18D, the electronic device 1850 may send a request for stopping power transmission to the wireless power transmitter 1800. The electronic device 1850 may send a request for power transmission to another wireless power transmitter 1830. Further, the electronic device 1850 may switch the state of the switch 1874 from off to on, based on the position of the other electronic device 1830. The other electronic device 1830 includes a core 1831 around which a coil 1832 has been wound. The coil 1832 may produce the magnetic flux. The coil 1861 and the coil 1863 may generate an induced electromotive force using the magnetic flux. Accordingly, the obstacle 1832 may be prevented from being affected by the magnetic flux.

Figure 19A:
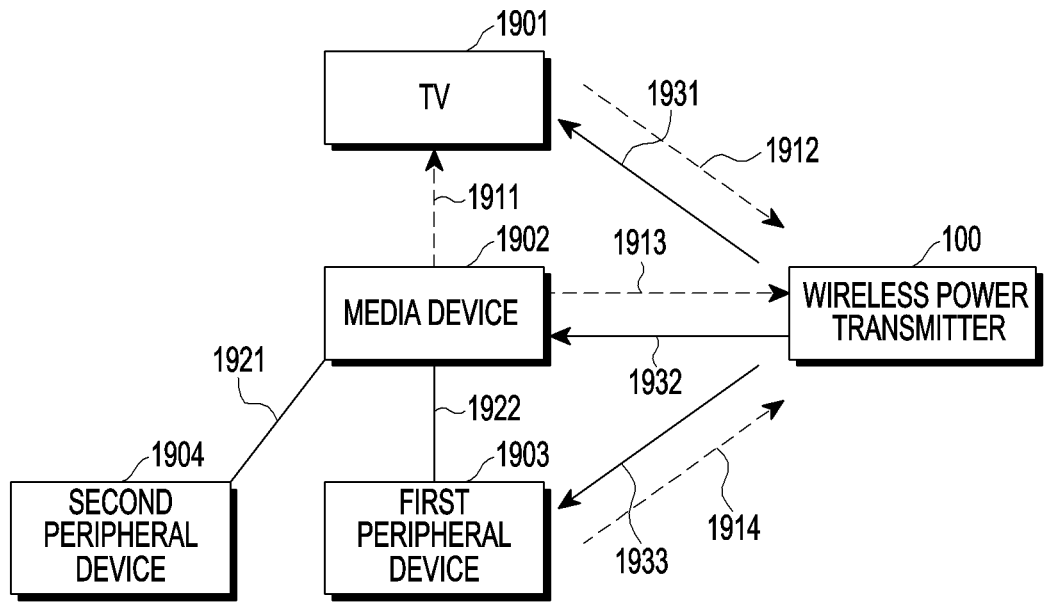
FIGS. 19A and 19B illustrate wireless power transmitters according to an embodiment.
Figure 19B:
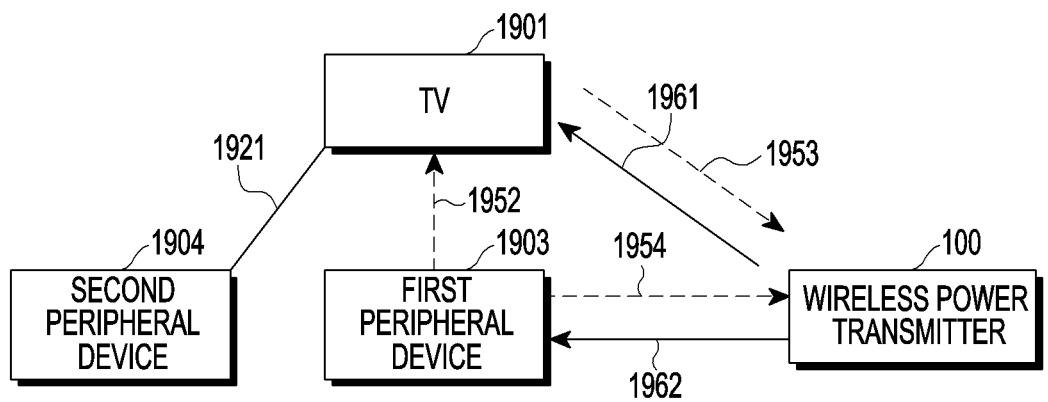

FIGS. 19A and 19B illustrate wireless power transmitters according to an embodiment.

Referring to FIG. 19A, a wireless power transmitter 100 may wirelessly transmit power to at least one of a TV 1901, a media device 1902, a first peripheral device 1903, and a second peripheral device 1904. The media device 1902 may be connected to the second peripheral device 1904 via a wire cable 1921 and to the first peripheral device 1903 via a wire cable 1922. The first peripheral device 1903 and the second peripheral device 1904 may be game players, DVD players, set-top boxes, or laptop computers. The first peripheral device 1903 and the second peripheral device 1904 may send media data to the media device 1902. Alternatively, the first peripheral device 1903 and the second peripheral device 1904 may send media data to the media device 1902 through wireless communication.

The media device 1902 may include the received media data in a communication signal 1911 and send the communication signal to the TV 1901. The TV 1901 may output the media data contained in the communication signal 1911.

The media device 1902 may include media data, which is received from any one of the first peripheral device 1903 or the second peripheral device 1904, in the communication signal 1911 and send the communication signal 1911 to the TV 1901. For example, the media device 1902 may include media data received from the first peripheral device 1903 in the communication signal 1911 and send the communication signal 1911 to the TV 1901.

The wireless power transmitter 100 may transmit power 1914 to the first peripheral device 1903, but not to the second peripheral device 1904. For example, the wireless power transmitter 100 may generate a magnetic field or RF wave corresponding to the position of the first peripheral device 1903 or send a charge disabled signal to the second peripheral device 1904, thereby abstaining from transmitting power to the second peripheral device 1904.

Alternatively, the wireless power transmitter 100 may transmit power for operation to the first peripheral device 1903 while transmitting power for maintaining the standby state to the second peripheral device 1904. For example, the second peripheral device 1904 may remain in the standby state while basic communication functions are performed but generation or transmission of media data is not performed.

For example, the TV 1901 may send a communication signal 1912 including information about a peripheral device to receive media data to the wireless power transmitter 100, and the wireless power transmitter 100 may transmit power 1914 to the first peripheral device 1903 based on the information contained in the communication signal 1912. The TV 1901 may determine which peripheral device is wiredly or wirelessly in connection with the media device 1902 or which peripheral device the media device 1902 receives the media data from. The TV 1901 may receive a signal associated with selecting a content source from a control device (e.g., a remote controller) and determine which peripheral device the media data is received from. For example, the TV 1901 may display a user interface associated with external input. The user interface may include text or images associated with the first peripheral device 1903 and the second peripheral device 1904. The TV 1901 may receive a selection of any one of the first peripheral device 1903 or the second peripheral device 1904 according to an input from the control device (e.g., a remote controller).

The wireless power transmitter 100 may detect a selection of the second peripheral device 1904 while transmitting power to the first peripheral device 1903. The wireless power transmitter 100 may stop transmitting power to the first peripheral device 1903 and transmit power to the second peripheral device 1904.

The wireless power transmitter 100 may include a plurality of antennas (coils), e.g., a first antenna for transmitting power to the TV 1901, a second antenna for transmitting power to the first peripheral device 1903, and a third antenna for transmitting power to the second peripheral device 1904. When power transmission to the second peripheral device 1904 commences while transmitting power to the first peripheral device 1903, the wireless power transmitter 100 may stop applying current to the second antenna and may apply current to the third antenna.

As another example, the media device 1902 may send a communication signal 1913 including information about a peripheral device to receive media data to the wireless power transmitter 100, and the wireless power transmitter 100 may transmit power 1914 to the first peripheral device 1903 based on the information included in the communication signal 1913. For example, the media device 1902 may receive a content source selection signal directly or from the TV 1901. The media device 1902 may send a request for transmitting media signals to a particular peripheral device based on the content source selection signal.

As another example, the first peripheral device 1903 may send, to the wireless power transmitter 100, a communication signal 1933 including information about a peripheral device to receive media data, and the wireless power transmitter 100 may transmit power 1914 to the first peripheral device 1903 based on the information contained in the communication signal 1933. The first peripheral device 1903 may send a communication signal 1933 to the wireless power transmitter 100, corresponding to a media signal transmission request from the media device 1902. The wireless power transmitter 100 may transmit power 1931 to the TV 1901 while transmitting power 1932 to the media device 1902.

The wireless power transmitter 100 may first transmit power for performing communication to all the peripheral devices 1903 and 1904. Thus, the second peripheral device 1904 may initially perform communication with the media device 1902 as well. Thereafter, when the first peripheral device 1903 is selected as the peripheral device to send media data, the wireless power transmitter may stop power transmission to the second peripheral device 1904.

The media device 1902 and the wireless power transmitter 100 may be integrated into a single body. In this case, the integrated device may send wireless power and media data both to the TV 1901.

Referring to FIG. 19B, the TV 1901 may receive the communication signal 1952 including media data directly from the first peripheral device 1903, without relaying by the media device 1902. The TV 1901 may send a communication signal 1953 including information about the selected peripheral device to the wireless power transmitter 100, or the first peripheral device 1903 may send a communication signal 1954 including the information about the selected peripheral device. The wireless power transmitter 100 may transmit power 1962 to the first peripheral device 1903, but not to the second peripheral device 1904, based on the received communication signals 1953 and 1954. The wireless power transmitter 100 may transmit the power 1961 to the TV 1901.

Figure 20:
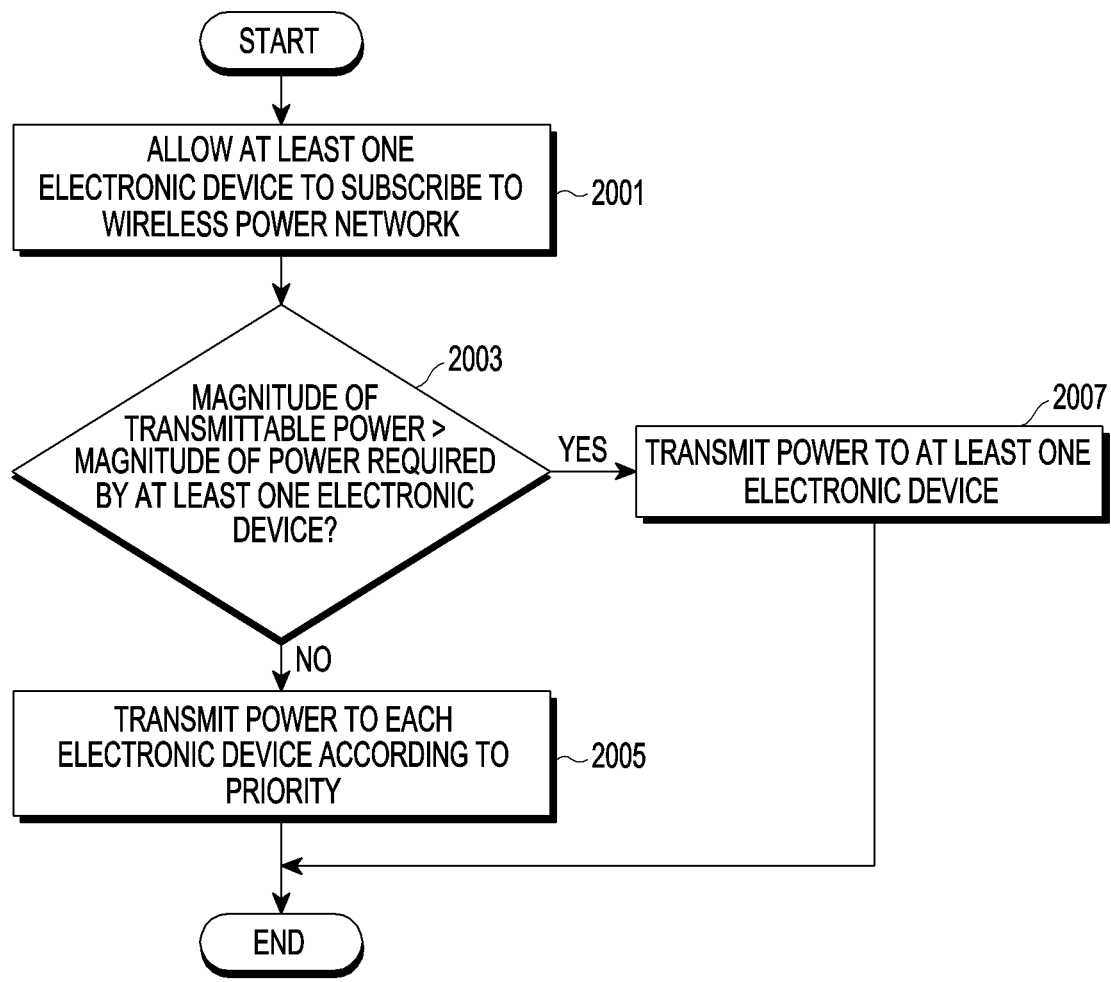
FIG. 20 is a flowchart illustrating a method for operating a wireless power transmitter according to an embodiment.

FIG. 20 is a flowchart illustrating a method for operating a wireless power transmitter according to an embodiment.

Referring to FIG. 20, in step 2001, the wireless power transmitter 100 allows at least one electronic device to subscribe to the wireless power network. The wireless power transmitter 100 may allow the electronic device to subscribe to the wireless power network by performing a procedure defined in a QI scheme or AFA scheme.

In step 2003, the wireless power transmitter 100 determines whether a magnitude of transmittable power is greater than the magnitude of power required by the at least one electronic device, e.g., based on the rated power information about the electronic device, based on information about each current state of the electronic device, and/or based on information about each power consumption of the electronic device.

The wireless power transmitter 100 may obtain a communication signal from the electronic device, thereby acquiring the rated power information, current state information, or power consumption information. The wireless power transmitter 100 may send test power, and in this case, may obtain the rated power information, current state information, or power consumption information based on the magnitude of current, voltage, power, or impedance sensed by the power transmitting circuit.

Upon determining that the magnitude of transmittable power is not greater than the magnitude of power required by the at least one electronic device, the wireless power transmitter 100 transmits power to each electronic device according to priority in step 2005.

Upon determining that the magnitude of power transmittable is greater than the magnitude of power required by at least one electronic device, the wireless power transmitter 100 transmits power the at least one electronic device in step 2007.

For example, the wireless power transmitter 100 may determine the priority of each electronic device based on an external input from the user. The wireless power transmitter 100 may determine the priority of each electronic device based on the remaining battery of each electronic device. The wireless power transmitter may transmit power to one electronic device according to priority or may simultaneously transmit power to a plurality of electronic devices having the same priority.

In a normal situation, the wireless power transmitter 100 may increase the power to a predetermined maximum magnitude and may determine the priority based on the product of per-electronic device transmit power and wireless power transmission/reception efficiency.

After determining the priority based on the product, the wireless power transmitter may adjust the priority by determining only the wireless power transmission/reception efficiency. The wireless power transmitter may first transmit power to the electronic devices with relatively higher priorities, even when the wireless power transmitter may also provide the minimum power for performing, e.g., communication, to the other relatively lower-priority electronic devices.

Each of the aforementioned components of the wireless power transmitter or electronic device may include one or more parts, and a name of the part may vary with a type of the electronic device. The electronic device in accordance with various embodiments may include at least one of the aforementioned components, omit some of them, or include other additional component(s). Some of the components may be combined into an entity, but the entity may perform the same functions as the described components.

Herein, the term "module" may refer to a unit including one of hardware, software, and firmware, or a combination thereof. The term "module" may be interchangeably used with a unit, logic, logical block, component, or circuit. A "module" may be a minimum unit or part of an integrated component. A "module" may be a minimum unit or part of performing one or more functions. A "module" may be implemented mechanically or electronically. For example, a "module" may include at least one of an application specific integrated circuit (ASIC) chip, an FPGA, and a programmable logic array (PLA) that perform some operations, which have already been known or will be developed in the future.

According to an embodiment, at least a part of the device (e.g., modules or their functions) or method (e.g., operations) may be implemented as instructions stored in a computer-readable storage medium e.g., in the form of a program module. The instructions, when executed by a processor, may cause the processor to carry out a corresponding function. The computer-readable storage medium may be e.g., the memory 105 or 156.

According to an embodiment, a storage medium is provided for storing instructions executed by at least one processor to enable the processor to perform at least one operation that may include determining that a first combination of the plurality of coils is a coil to wirelessly receive power from a wireless power transmitter and performing control to connect the first combination of the plurality of coils to the power processing circuit.

The above-described commands may be stored in an external server and may be downloaded and installed on an electronic device, such as a wireless power transmitter. Accordingly, the external server may store commands that are downloadable by the wireless power transmitter.

The computer-readable storage medium may include a hardware device, such as hard discs, floppy discs, and magnetic media (e.g., a magnetic tape), optical media such as compact disc ROMs (CD-ROMs) and DVDs, magneto-optical media such as floptical disks, ROMs, RAMs, flash memories, etc. Examples of the program commands may include not only machine language codes but also high-level language codes which are executable by various computing means using an interpreter. The aforementioned hardware devices may be configured to operate as one or more software modules to carry out exemplary embodiments of the present disclosure, and vice versa.

Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, simultaneously, repeatedly, or heuristically. Further, some of the operations may be performed in a different order, or omitted, or include other additional operation(s).

As is apparent from the foregoing description, according to various embodiments, a relatively high wireless power transmission/reception efficiency may be provided, despite a position change of the wireless power transmitter or the electronic device.

According to various embodiments, the power transmission coil or the magnetic material in the coil may avoid saturation despite wireless transmission/reception of a relatively high magnitude of power, e.g., power having a magnitude higher than a predetermined magnitude threshold.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. An electronic device, comprising:
   a sensor configured to sense data about an ambient area around the electronic device;
   a plurality of coils;
   a power processing circuit configured to process power received through the plurality of coils from a wireless power transmitter;
   a switching circuit configured to selectively connect at least one of the plurality of coils to the power processing circuit; and
   a control circuit configured to:
   determine a position of the wireless power transmitter and a position of an obstacle using the sensed data;
   select at least one coil from among the plurality of coils based on the determination; and
   control the switching circuit to connect the selected at least one coil to the power processing circuit.

2. The electronic device of claim 1, further comprising a sensor configured to measure a magnitude of power output to the power processing circuit,
   wherein the control circuit is further configured to control the switching circuit to:
   sequentially connect a plurality of combinations of the plurality of coils to the power processing circuit,
   sequentially obtain a plurality of magnitudes of power output to the power processing circuit through the sensor while each of the plurality of combinations is in connection with the power processing circuit, and
   select the at least one coil based on the plurality of magnitudes of power.

3. The electronic device of claim 2, wherein the control circuit is further configured to determine a combination corresponding to a largest one of the plurality of magnitudes of power as the selected at least one coil.

4. The electronic device of claim 2, wherein the control circuit is further configured to:
   determine a plurality of wireless power transmission/reception efficiencies, each of which corresponds to a respective one of the plurality of magnitudes of power, and
   select the at least one coil based on the plurality of wireless power transmission/reception efficiencies and the plurality of magnitudes of power.

5. The electronic device of claim 1, wherein the control circuit is further configured to control the switching circuit to connect a combination of the plurality of coils, which is different from the selected at least one coil, to the power processing circuit, corresponding to a movement of the obstacle to a predesignated area.

6. The electronic device of claim 5, wherein the control circuit is further configured to control the switching circuit to connect the selected at least one coil to the power processing circuit, corresponding to movement of the obstacle out of the predesignated area.

7. A method for operating an electronic device including a plurality of coils and a power processing circuit, the method comprising:
   determine a position of the wireless power transmitter and a position of an obstacle using sensed data about an ambient area around the electronic device,
   selecting at least one coil from among the plurality of coils to wirelessly receive power from a wireless power transmitter, based on the determination; and connecting the selected at least one coil to the power processing circuit.

8. The method of claim 7, further comprising:
sequentially connecting a plurality of combinations of the plurality of coils to the power processing circuit; and
sequentially obtaining a plurality of magnitudes of power output to the power processing circuit, the plurality of magnitudes of power output respectively corresponding to the plurality of combinations,
wherein the selected at least one coil is determined based on the plurality of magnitudes of power.

9. The method of claim 8, wherein a combination corresponding to a largest of the plurality of magnitudes of power is selected.

10. The method of claim 8, further comprising determining a plurality of wireless power transmission/reception efficiencies, the plurality of wireless power transmission/reception efficiencies respectively corresponding to the plurality of magnitudes of power,
wherein the at least one coil is selected based on the plurality of magnitudes of power and the plurality of wireless power transmission/reception efficiencies.

11. The method of claim 7, further comprising connecting a combination of the plurality of coils, which is different from the selected at least one coil, to the power processing circuit, corresponding to a movement of the obstacle to a predesignated area.

12. The method of claim 11, further comprising connecting the selected at least one coil to the power processing circuit, corresponding to movement of the obstacle out of the predesignated area.

* * * * *